United States Patent [19]

Doehler et al.

[11] Patent Number: 4,883,686

[45] Date of Patent: Nov. 28, 1989

[54] METHOD FOR THE HIGH RATE PLASMA DEPOSITION OF HIGH QUALITY MATERIAL

[75] Inventors: Joachim Doehler, Union Lake; Stephen J. Hudgens, Southfield; Stanford R. Ovshinsky, Bloomfield Hills; Buddie Dotter II, Utica; Lester R. Peedin, Oak Park; Jeffrey M. Krisko, Highland; Annette Krisko, Highland, all of Mich.

[73] Assignee: Energy Conversion Devices, Inc., Troy, Mich.

[21] Appl. No.: 199,062

[22] Filed: May 26, 1988

[51] Int. Cl.$^4$ .............................................. B05D 3/06
[52] U.S. Cl. ......................................... 427/38; 427/47
[58] Field of Search ................................ 427/38; 1/47

[56] References Cited

U.S. PATENT DOCUMENTS 4,656,052 4/1987 Satou et al. .......................... 427/38
4,657,774 4/1987 Satou et al. .......................... 427/38
4,683,149 7/1987 Suzuki et al. ......................... 427/38
4,778,561 10/1988 Ghanbari ......................... 427/38 X Primary Examiner—Bernard D. Pianalto
Attorney, Agent, or Firm—Marvin S. Siskind; Richard M. Goldman; Kenneth M. Massaroni

[57] ABSTRACT

A method of forming a high flux of activated species, such as ions, of an energy transferring gas by employing a substantial pressure differential between a first conduit in which the energy transferring gas is introduced into a vacuumized enclosure and the background pressure which exits in said enclosure. In one embodiment, the flow rate of the energy transferring gas flowing through said first conduit, when taken in conjunction with said pressure differential, causes the high flux of activated species of the energy transferring gas to collide with a precursor deposition/etchant gas, remotely introduced into the enclosure through a second conduit, for forming deposition/etchant species therefrom. In an alternate embodiment, the pressure differential causes those activated species, themselves, to be either deposited upon or etched away from the surface of a remotely positioned substrate.

41 Claims, 3 Drawing Sheets

A.D. McDONALD & S.C. BROWN PHYS REV. 75 41 (1949)

METHOD FOR THE HIGH RATE PLASMA DEPOSITION OF HIGH QUALITY MATERIAL

FIELD OF THE INVENTION

The instant invention relates generally to the deposition and removal of thin films of material through the generation of a high flux of activated species of an energy transferring gas adjacent the apertured end of a first conduit through which the gas is introduced into an enclosure. More particularly, the instant invention relates to a method of generating a high density of only desired energized species for the deposition of thin films of material onto or the removal of thin films of material from the surface of a remotely located substrate. Whereas, it has previously been possible to either deposit relatively poor quality material (such as semiconductor alloy material, dielectric material or diamond-like material) at a relatively high rate of deposition, or to deposit relatively high quality material at a relatively low rate of deposition; the concepts disclosed by the instant invention now make it possible to obtain the best of both worlds and deposit high quality thin film material at very high rates of disposition. The result is the ability to fabricate high quality films in a commercially significant, economical manner. Also due to the extremely high flux of ionic species which are activated (an ion flux of over 25 milliamps per square centimeter), it is possible to etch material from the surface of a remotely located substrate with efficiencies heretofore attainable only in bipolar ion etching processes.

Note that, as used herein, the term "energy transferring gas" will refer to a gaseous precursor which is adapted to be activated by an external source of energy for generating activated species (ionic, free radical or otherwise excited neutrals) thereof and either (1) transferring the energy thereof through collisions with remotely located deposition/etchant gas; or (2) transferring the energy thereof through a chemical reaction which occurs on the surface of a remotely located substrate. In light of this definition, the invention disclosed herein, in its broadest form, relates to the ability to generate activated species from a relatively high percentage of the energy transferring gas flowing through an activation region and transmitting a high flux of those activated species to a remote location.

BACKGROUND OF THE INVENTION

In order to assist the reader in appreciating the scope and importance of the instant invention, the following paragraphs will trace the history of thin film deposition and etching processes. This historical perspective will demonstrate that despite centuries of effort, prior to this invention, scientists were unable to deposit high quality thin film material at high rates of deposition.

Thin film fabrication can be categorized broadly as either processes for the mechanical deposition of thin material or processes for the vapor deposition of thin film material.

MECHANICAL DEPOSITION TECHNIQUES

First, as to the mechanical processes, thin films have been used for decorative purposes for well over a thousand years. One of the earliest thin films to be deposited was "gold leaf" formed by the controlled beating of gold to a thickness of about 0.1 micrometers. As early as the seventh century, glass and ceramics were decorated by painting a pattern with silver salt, then heating the painted object to cause reduction of the salt to a thin film of metallic silver. Other mechanical processes include painting and plating.

From these humble beginnings, diverse fields of thin film technology have evolved, which fields reveal a significant presence in virtually every area of modern industry. Indeed, thin film processing is commonly employed in fields ranging from electroplated coatings used for decorative and protective purposes to the electrically conductive, resistive, magnetic, insulating, semiconductive and even superconducting films used in microelectronics. In contrast thereto, the instant invention, is directed toward the deposition of thin film material through plasma type processing. The shortcomings inherent in prior art plasma deposition technologies will be detailed in the paragraphs which follow hereinafter so that the reader may better understand the significant technological advances disclosed by the novel deposition methodology set forth herein.

VAPOR DEPOSITION TECHNIQUES

Vapor deposition requires the generation of a plasma. Plasmas, which have been described as the fourth state of matter (i.e., solid, liquid, gas and plasma), make up a substantial portion of all matter in the known universe. Plasmas comprise mobile, positively and negatively charged particles that interact because of the attraction or repulsion resulting from the electric fields surrounding each charged particle, i.e., Coulomb forces. Plasmas are further characterized by relatively large intermolecular distances, large amounts of energy stored in the internal energy of the particles and the presence of a plasma sheath at all boundaries. Individual atoms and molecules exhibit some internal properties that are plasma-like. Furthermore, liquids and solids exhibit the collective behavior of charged particles that is characteristic of the plasma state. The types of plasmas which will be discussed hereinafter relate to synthetic gaseous plasmas. Typically, the density of opposite charges in a gaseous plasma is equal and thus the plasma is electrically neutral. However, non-neutral plasmas can be formed by allowing for the preferential escape of either positively or negatively charged particles; or conversely, by the injection of either electrons or ions thereinto. Plasma particle species include neutral atoms, electrons and ions.

Gaseous plasmas can be viewed as carriers of matter and energy. The initial and final form of the material that enters a plasma and the energy required for the fabrication thereof vary widely, depending on the particular plasma source and its method of utilization. Steady-state plasmas are most often formed from gases.

As is well known, the energy required for plasma formation can be supplied from a variety of sources. For example, the energy source can be internal, such as the evolution of chemical energy which occurs when a material is flamed or atomized. A second source of plasma forming energy involves the electric discharge through a gaseous material. Electric discharge involves an externally applied d.c. or a.c. field which internally heats the plasma so that the plasma forms part of the electric circuit. Another potential source of energy for plasma formation includes optical energy, externally applied by beam or beams of photons (such as laser beams or energetic particles), that create a plasma by their impact and absorption independently of the source. It should be noted that plasmas may be produced by a number of other methods, the most well known of which include the use of strong shock waves. Of course, chemical, electric discharge and high frequency sources often produce steady state plasmas, whereas beam and shock heating typically produce pulsed plasmas.

In many instances, it is desirable to restrain the tendency of a gaseous plasmas to expand. Indeed, compressing a plasma may be necessary for purposes of maintaining the plasma and for the exclusion of contaminants. Plasmas may be confined by structural walls and/or by the use of magnetic fields. A third type of confinement depends upon the inertial tendency of ions and associated electrons to restrain a plasma explosion for a brief, but useful, period of time. This inertial confinement is usually preceded by inward plasma motion and compression; therefore, this confinement technique depends on plasma heating (as from a pulse of laser photons, electrons or ions) outpacing plasma expansion.

A plasma loses matter and energy through particle escape and radiation of photons. When matter or energy are no longer supplied to a plasma, it expands and cools before interacting with the surroundings and totally dissipating. Such processes must be offset during the lifetime of a plasma since the material and energy from a plasma often produces undesirable effects, e.g., in proposed thermonuclear fusion reactors.

The use of a high energy plasma as the energy transferring vehicle for decomposing or energizing a precursor deposition species, (as for the subsequent formation of a thin films of material), represents the ultimate stage in the evolution of this art. Prior to reviewing current plasma deposition efforts, which efforts have heretofore proven inadequate, it may be useful to revisit the evolution of traditional thin film plasma deposition technologies. Thus, in the following paragraphs, there are presented a series of short biographies summarizing the most significant of the currently utilized thin film, plasma deposition techniques.

Vapor deposition techniques can be divided into categories depending whether the material sticks to the surface of the substrate or reacts with the surface to produce the depositing species. The following represent physical vapor deposition processes wherein material adheres to the substrate surface.

PHYSICAL VAPOR DEPOSITION

1. Vacuum Evaporation: While, on one hand, vacuum deposition techniques are most useful for the evaporation of materials such as metal alloys or simple inorganic compounds, i.e., as oxides, halides, sulfides, selenides and tellurides; on the other hand, complex inorganic compounds as well as sulfates, nitrates and phosphates readily decompose, and thus are not suitable for evaporation. In the fabrication of microelectronic circuitry, the deposition process is conducted in a vacuum system that may be as simple as a bell-jar or as complex as an advanced in-line system of multiple vacuum chambers that provide interchamber substrate interactions without breaking vacuum and that include mask changers, evaporation sources and substrate heaters. Materials may be evaporated sequentially through respective masks. Vacuum deposition techniques have been employed in conjunction with nickel-chrome alloys, rhenium, nickel, titanium and other resistive metals for the deposition of thin film resistors. For dielectric coatings, silicon monoxide is commonly employed, though other materials such as, magnesium fluoride, have also been successfully employed. Thin film electrically conductive coatings are formed from aluminum, silver, gold, copper, chrome and other good metallic conductors.

Source heaters such as a stranded tungsten coil filament, are used for depositing the electrically conductive materials such as aluminum. Silicon monoxide, the most commonly evaporated dielectric utilizes an electrically powered evaporation source fabricated from a refractory metal. The design of the deposition system prevents line of sight evaporation from solid silicon monoxide to the substrate and thus avoids the ejection of particles that would otherwise cause defects in the depositing film. Electron beam evaporation in a $10^{-4}$ mm Hg ($10^{-4}$ torr) pressure regime vacuum system has also been employed.

2. Ion Plating: The technique used for the evaporation of a coating material in the positive glow region of a vacuum discharge is known as ion plating. The ionized evaporant is accelerated to the surface of the negative electrode under the influence of an electrical field in a low pressure d.c. discharge (usually of argon). In the process, the deposition of a thin film onto a substrate is maintained at a faster rate than the sputtering removal of material from that surface. As a result, the depositing film grows in thickness with time.

In practice, the substrate to be coated is placed in a vacuum chamber in which the pressure is initially reduced to about $5 \times 10^{-6}$ mm Hg and then an inert gas is introduced while the pressure is held to within a factor of 10 of the original value. A negative bias of several thousand volts with respect to the plasma is applied to the substrate (the cathode). The surface of the substrate is first cleaned by ion bombardment to remove any surface oxides and form nucleation sites. The evaporation of the coating material is then initiated and maintained for a length of time sufficient to deposit the desired film thickness.

Several advantages are inherent in ion plating techniques, vis-a-vis, other vacuum deposition processes. For example, ion plating: (1) is not limited to line-of-sight deposition because of the effect of the electrical lines of force on the dispersion of ions; (2) the deposited coating demonstrates superior adhesion because of the high energy imparted to the material, which energy can even result in ion implantation; (3) the substrate need not be rotated in order to achieve coatings which are of uniform thickness; and (4) unusual substrate materials, such as titanium, can be ion-plated (as with copper). Unfortunately, the utility of ion plating is limited by several inherent disadvantages. These disadvantages include: difficulty in masking parts from coating by the depositing ions; the relative expense of utilizing the process; and damage to the substrate and deposited film resulting from continuous bombardment by the accelerated ions.

3. Sputtering: Sputtering is a process by which material is removed from a source or target (the cathode), said material carried by a plasma and deposited upon the surface of a substrate (the anode). Sputtering is the most common alternative to vacuum evaporation processes and is capable of depositing materials providing consistent sheet resistivities and improved temperature coefficients of resistance. For the deposition of metal oxides and alloys, sputtering is generally preferred to vacuum evaporation. The disadvantages of sputtering, as compared to vacuum evaporation are the higher cost of equipment and operation, the complexity of the equipment and the slower rates of deposition. In addition, when bias sputtering is not employed or when the gas pressure within the sputtering chamber is excessive, entrapment of gas within the deposited film becomes a factor which degrades the quality of the deposited film. Further, sputtering is considered to be an inefficient process because as much as 90% of the supplied energy is transformed into heat. Poor energy transfer between the substrate, the substrate holder, and the anode table raise the substrate temperature as high as 300° C. Of course, this may be an advantage in annealing structural defects on the film being deposited.

Diode sputtering employs a glow discharge with an inert gas such as argon. Material is removed from a water-cooled target by momentum transfer owing to the attraction of positively charged ions in the inert gas in an electrically controlled plasma. The impact of the positively charged ions dislodges atoms of the cathode material which are then accelerated by an applied electric field toward the substrate which is affixed to a water-cooled anode table. Ions formed by sputtering strike the substrate surface with energies between ten and several hundred electron volts (electroplating, by contrast, only develops a few tenths of an electron volt). Some of the sputtered atoms develop sufficient energy to penetrate several atomic layers into the substrate surface, resulting in adhesion anchoring and films of excellent adhesion. Sputtering is a suitable process for depositing multi-layer films and films of complex alloys and dielectrics.

At this point, it will be informative to note that substrate surface cleanliness is critically important in order to attain good adhesion of the depositing film. The nature of the bond formed between the surface and the film depends upon the film and substrate materials; it may be a chemical or metallic bond or a van der Waals interaction. Sputtering rates are dependent upon the material and the heat of sublimation.

Diode sputtering or conventional r.f. sputtering represent the sputtering techniques most often used for applications involving the deposition of conductive and insulating materials. In order to ionize the gas at lower pressures than are used in the diode system, a modified technique called triode sputtering can be employed. This method includes an accelerating voltage which is varied over a wider range than can be employed with the diode system. As a result, better control of the physical properties of the coating can be achieved, sputtering efficiency is increased and diffusion of sputtered atoms is decreased. Several individual target materials inside the chamber can provide a variety of combinations or utilize different power levels for sputtering at different rates. The sequential use of different target materials can produce a graded coating or overcome coating incompatibility by providing a buffer coat. Targets of several material combinations are also used to provide heterogeneous coatings.

Planar magnetron sputtering is a particularly noteworthy technique in which a closed magnetic field loop confines and compresses the plasma, thereby causing the ionized gas to sputter more efficiently. Under the influence of the two fields (electrical and magnetic), the electrons travel in a cycloidal path rather than in straight lines, thereby greatly increasing the probability of ionizing collisions and producing a highly dense plasma near the target surface. The net result is to create a higher ion flux with deposition rates 5 to 20 times those of conventional d.c. or r.f. diode sputtering methods. Modification of the cathode to an elongated rectangular shape provides for a deposition which is less affected by plasma and gives uniformity of coating thickness.

Another modification of r.f. sputtering is reactive sputtering in which small amounts of oxygen or nitrogen are introduced into the chamber along with argon. This gas mixture reacts with the atoms of material removed from the target and converts the deposited coating to an oxide or nitride of the original target material. For example, aluminum may be sputtered in an argon-oxygen plasma gas mixture so as to form an aluminum oxide film.

As discussed hereinabove, when sputtering electrically conductive materials, the power supply may be d.c. or r.f. However, a polymeric insulating material used as the cathode in the sputtering process takes on a positive charge during d.c. glow discharge and does not attract ions. As a result, the insulating material resists the starting or maintenance of a d.c. glow discharge. r.f. energy must therefore be used instead. The glow discharge is generated by an r.f. field developed between the cathode located at the top of the sputtering chamber and the substrate situated on the anode base. Subjecting the target to a source of r.f. power operating at a frequency of 13.56 MHz gives the target a negative bias, thus causing it to become a cold cathodic electron emitter. Free electrons leaving the target ionize part of the gas creating positive ions, which ions are accelerated toward the polymeric target, striking it and thereby dislodging atoms. The dislodged atoms impact upon the substrate at high energy creating atomic bonding between the deposited coating and the substrate. During the first half of the discharge cycle, the target is bombarded by ions and neutralization of the surface charges by the electrons follows. Sputtering occurs because the insulator is subjected alternately to ion and electron bombardment. The positive cycle portion and the target material is always ready for bombardment.

In a three electrode, or triode sputtering system, a thermionic cathode, an anode and a target are provided. The energized filament emits electrons and ionizes the sputtering gas, and the negatively biased target material attracts the positive ions. The advantage of a triode sputtering system is that the glow discharge can be maintained at $10^{-4}$ torr as compared to the $10^{-2}$ torr required for diode sputtering. The triode sputtering method also provides for a higher rate of deposition of materials, owing to larger mean-free paths at lower pressure. These larger mean-free paths result in less backscattering of sputtered atoms with more atoms contacting the substrate. However, deposition rates are generally low because in ionic bombardment of a surface, most of the available energy is manifested as heat and only a small portion is then available for kinetic energy of the ejected atoms. Typical deposition rates are on the order of 1 micron per hour (2.5–3 Angstroms per second). Increasing the sputtering rate becomes a problem because the target temperature must be decreased. Increasing the voltage increases the sputtering rate, but only up to a point, because too high a voltage results in gas ions penetrating the target surface without dislodging atoms.

The second category of vapor deposition techniques is chemical vapor deposition.

CHEMICAL VAPOR DEPOSITION (CVD)

Chemical vapor deposition is a process in which a substrate is coated with vapors of volatile chemical compounds at a temperature below the melting point of the substrate. The precursor compound is reduced or disassociated, in a chemical reaction on the substrate surface, thereby resulting in an adherent coating deposited on the substrate. An example of the process is titanium vapor plating by the reduction of titanium tetrabromide mixed with hydrogen at an elevated temperature. The mixture is conducted over the substrate surface which is heated to a temperature of about 1300° Centigrade. The mixture then decomposes, depositing a thin film of titanium metal upon the exposed surface of the substrate. The CVD technique is also applicable to the decomposition of a surface coating of refractory metals and compounds such as the carbide of tantalum and silicon, tin oxide and carbon. The advantages of the process include the deposition of coatings varying in thickness from the ultra thin i.e., 10's of Angstroms up to thicknesses of many millimeters. The main disadvantage inherent in CVD is the necessity of heating the surface of the substrate to be coated to high temperatures. This has the effect of degrading the substrate, and can in fact have deleterious effects upon the quality of the deposited species. Commercially, CVD is used to produce epitaxially grown single crystal silicon by the reduction of silicon tetrachloride with hydrogen and to make epitaxial compounds, polysilicon, silicon nitride, silicon dioxide, and both doped polysilicon and silicon dioxide. Other commercial uses of CVD are the deposition of thin films of carbon by pyrolytic decomposition of organic materials and the manufacture of capacitors of titanium dioxide with high dielectric constants.

1. Shock Wave-induced Reactions: Shock wave-induced reactions between relatively simple elements and molecules have been carried out in small scale laboratory settings. Shock waves are fully developed compression waves of large amplitude, across which density, pressure and particle velocity change drastically. Experimentation with shock wave-induced reactions has demonstrated coupling between vibrational excitation and reaction rate for a variety of bimolecular reactions, non-Arrhenius behavior of rate constant expressions and participation of radical-radical processes in decomposition and isotope exchange reactions.

While shock wave-induced reactions have proven quite useful as a tool for studying reaction mechanisms and elementary reaction rate constants, there has to date been no large scale use of them for commercially viable processes. Unfortunately, very little work has been done which would advance shock wave technology beyond the stage of laboratory curiosity. Thus, while shock wave-induced reactions have provided an excellent means by which to observe excitation and reaction of the task of various bimolecular compounds, it is wholly unsatisfactory for the task of decomposing gases for subsequent chemical vapor deposition upon the exposed surface of a substrate.

2. R.F. Glow Discharge: At ambient pressures and temperatures, gases are poor conductors of electricity. However, at elevated temperatures or under reduced pressures, gases will conduct electricity when subjected to a strong electrical field. Under these conditions, gas becomes partially ionized and the free electrons and ions contained therein carry current. In a glow discharge, the free electrons in the electrical field collide with gas molecules and transfer energy thereto. Electron-molecule collisions result in molecular excitation and in dissociation and ionization of the gas molecules. Free radicals, positive and negative ions are formed and ultraviolet, visible and infrared radiation is emitted. The CVD process then proceeds with the deposition of these species upon the exposed surface of a substrate. The low temperature plasma deposition of thin inorganic films is of particular importance to the semiconductor industry and microelectronics industry. Thin inorganic films of silicon oxide and nitride have been prepared in an r.f. plasma by allowing silane to react with water or ammonia. While the r.f. glow discharge deposition of thin films of inorganic materials has proven commercially effective, there are several crucial factors which limit the utility of glow discharge deposition. These factors will be discussed in depth hereinbelow.

R.F. glow discharge has also been successfully employed in the preparation of thin organic polymeric films. When an organic substance in the vapor phase is excited to luminescence by an electric discharge, a solid film tends to deposit on all surfaces exposed to the plasma. However, the use of glow discharge to initiate polymerization is a rather violent method leading to fragmentation of the original monomer and incorporation of these fragments in the polymer. In a typical glow discharge polymerization process, the deposition chamber is first evacuated to a pressure of about $7.5 \times 10^{-3}$ torr. Argon is then introduced into the chamber while the pressure increases to about $10^{-1}$ torr. The source of r.f. energy is activated and the power level is adjusted to 250 watts so as to provide a brilliant violet plasma. A flow of the precursor monomer gas is initiated and adjusted until the glow is quenched just at the surface of the substrate to be coated.

Although r.f. glow discharge can be used for polymeric formation of thin films, the physical appearance and properties of the coating in general depend on the conditions employed. The deposited film is typically highly branched, cross-linked and unsaturated regardless of the starting vapors. Under conditions of relatively high monomer vapor pressure and low current density, films are usually clear and transparent but soft and tacky, thereby suggesting incomplete polymerization; under conditions of low vapor pressure and high current density, the films produced are mechanically hard and often discolored (yellow or brown) because of cross-linking. In addition, when the current density is relatively high with an extended deposition time, films may degrade and appear blistered or loosely adherent. Other disadvantages of glow discharge polymerization reactions are the difficulty of obtaining high resolution patterns and precise control of film composition owing to the variety of recombining species and the possibility of contamination or sputtering. In addition, relatively high gas pressure is required and considerable substrate heating results.

R.F. glow discharge has consistently demonstrated the ability to provide the highest quality of deposited thin films of semiconductor alloy material. The quality of thin films of deposited semiconductor alloy material typically is measured in terms of the density of localized defect states which exist in the energy gap thereof. However, other parameters may materially affect, in a deleterious fashion, the electronic and optical properties of the depositing semiconductor film. Despite the relatively low defect density present in the energy gap of r.f. glow discharge deposited silicon alloy material, said defect density remains orders of magnitude higher than the defect density of crystalline silicon. This is particularly true in terms of narrow band gap semiconductor alloy materials fabricated from silicon germanium alloys wherein (in the best 1.35–1.65 eV material) the density of localized defect states in the energy gap still remains in the mid-$10^{16}$ defects/cm$^3$/eV range. Of course, in order to obtain high quality material exhibiting even this relatively high defect density, it is necessary to introduce different, but complementary compensating elements into the glow discharge plasma. Further, and very importantly, regardless of the power employed, the rate of deposition remains low (less than 15 Angstroms/second). It has been demonstrated that the introduction of a first compensating element, such as hydrogen, is effective in reducing the localized states in the energy gap of silicon alloy material at or near the Fermi level, while the introduction of a second compensating element, such as fluorine, further reduces those localized states, as well as other states, between those near the Fermi level and the conduction band. Due to the relatively low energy imparted by any r.f. field, regardless of the power level employed, to the plasma of decomposed precursor gases, the rate of deposition remains relatively low. This relatively slow deposition rate provides the fluorine and hydrogen compensating elements with a sufficient length of time to be able to react with the depositing host matrix and relax dangling, broken, stressed, or strained bonds in the narrow band gap silicon germanium alloy material as that material is depositing on the surface of said substrate.

However, and as should be apparent to the reader, in a commercial fabrication process, a significant problem has been found to exist in the deposition of high quality silicon alloy material. When the rate of deposition of the narrow band gap semiconductor alloy material (and indeed the deposition rate of any semiconductor or insulating material) is raised in order to deposit that material in a commercially economical manner, the quality of the deposited material deteriorates. More particularly, previous attempts to increase the rate of deposition of semiconductor alloy material (e.g., from as little as 10 Angstroms per second to 12 Angstroms per second), as by increasing the r.f. power being utilized, results in a more energetic plasma. This more energetic plasma either changes the plasma reaction kinetics to produce a different set of ions and free radicals, or that energetic plasma fails to allot the compensating elements a sufficient period of time in which to interact with the host matrix of the depositing semiconductor alloy material for relaxing the strained, broken, dangling, stressed or otherwise deviant bonding configurations thereof. Although the foregoing paragraphs have dealt primarily with the deposition of narrow band gap semiconductor alloy material, the same deterioration in material quality (an increase in the density of defect states) with increasing power is universally reported and has been experimentally seen in the plasma deposition of wide band gap semiconductor alloy material.

Before continuing, it will be helpful to briefly consider some of the plasma kinetics which occur in r.f. or microwave initiated glow discharges. Experimental observations of the electronic defect density of multi-element amorphous silicon alloy films deposited from a great number of different gas chemistries (using both r.f. and microwave energy) reveal that deposited thin films deposited from combinations of precursor gases having comparable individual "deposition efficiencies" exhibit the highest quality electronic properties. Based upon those observations, it becomes possible to modify the characteristics of the deposited thin film material. However, the degree of modification possible is limited because of the uncontrollable chemistry provided by the "zoo" of chemical reactions generated in the highly energetic plasma. More particularly, in the plasma, the precursor feedstock gases experience multiple collisions with plasma electrons to generate a host of free radicals and ions. It is necessary to pay the most attention to the free radicals which have been generated because experience has demonstrated that free radicals represent the plasma species which is deposited onto a substrate.

With respect to those free radicals, note that there exists a distribution of free radicals depending upon the electron temperature, the electron density and the residence time of the gaseous precursor exposed to the electromagnetic field. The residence time dependence results from multiple electron collisions or collisions between previously excited free radicals and feedstock molecules or between two or more free radicals. In a silane feedstock plasma, the lowest energy member of the possible free radicals which can be generated is $SiH_3^*$, with higher energy members including $SiH_2^*$, $SiH^*$ and $Si^*$.

Since a plasma, in order to be self-sustaining, must contain electrons with sufficient energy to generate ions via collisions with feedstock molecules, and due to the fact that the energy required to generate an ion is generally higher than the energy required to generate the lowest energy member of the free radical spectrum (This assumption will be revisited in the portion of the instant specification which deals with the effect of a magnetic field on the deposition process of this invention.), it is possible to assume that a distribution of free radicals will be created in any plasma (the breadth of the distribution being dependent upon the power absorbed by the plasma).

Considering now the process by which thin films are grown in a plasma deposition process, it can be assumed that the depositing gaseous mixture is a compound which comprises n SCCM of molecule A and m SCCM of molecule B. It is further possible to assume that a fraction of A molecules ($ETA_A$ are converted to depositing free radicals which diffuse to and "stick" on the substrate. There exists a similar "deposition efficiency" coefficient for B molecules ($ETA_B$). Therefore at a given a.c. power density, a mixture of $n(ETA_A)+m(ETA_B)$ will be available for the deposition of thin films (where both $ETA_A$ and $ETA_B$ are dependent on plasma power). This will result in the fabrication of a thin film of material, the composition of which thin film can be varied by utilizing different combinations of plasma power densities or by changing the relative initial flow rates of feedstock gases (n/m). Alternatively, the same composition of depositing material can also be obtained from a given combination of feedstock gas by changing plasma power or by changing the ratio of flow rates of feedstocks gases (n/m).

From the previous discussion of plasma chemistry and kinetics, it should be appreciated that the problem of the deteriorating quality of depositing thin film material relative to an increase in a.c. power can be controlled (to some degree) when dealing with the relatively low power levels generated by r.f. energy. However, the ability to increase rates of deposition from 10 to 12 or even to 20 Angstroms per second is not commercially meaningful. Therefore, recently, researchers have sought to utilize microwave frequencies (including elaborate electron cyclotron resonance schemes) so as to obtain over one order of magnitude improvement in the rate of deposition of a wide variety of thin film materials. Through the use of more energetic microwave initiated glow discharge deposition techniques, it has become possible to obtain an increased rate of deposition through the more efficient disassociation of the gaseous precursors from which the plasma is formed. The trouble which the aforementioned researchers have encountered is that at the same time that the economics of the microwave initiated deposition process has been greatly enhanced by an increased rate of deposition, the quality of the depositing film has been correspondingly compromised. In other words, for example, the best microwave deposited semiconductor alloy material has a defect density about an order of magnitude higher than the defect density of the best r.f. deposited semiconductor alloy material, i.e., quality is sacrificed for quantity.

3. Microwave Glow Discharge: The reader should note that the assignee of the instant invention has previously described, in U.S. Pat. Nos. 4,504,518, 4,517,223, and 4,701,343, an important low pressure method by which high quality films can be deposited using microwave energy. This low pressure, microwave deposition process remains, up to the date of this invention, the most efficient and cost effective manner of depositing relatively high quality semiconductor, insulating, dielectric, or hard thin films. More particularly, the invention described therein relates to the use of a low pressure regime in which to initiate a glow discharge deposition, whereby the plasma is efficiently maintained, without polymer formation. This is accomplished by operating at a substantial minimum of the "modified Paschen curve" for the given set of gaseous precursors being employed. In a nutshell, this means that for a particular gaseous precursor mixture, there exists an optimum combination of power, pressure and aperture diameter which will sustain a plasma of a given volume. Following the inventive scheme disclosed therein, it becomes possible to both obtain a highly energetic plasma in which all process gases are disassociated and in which the rate of deposition is substantially increased, vis-a-vis, the rate of deposition of r.f. plasmas; both features accomplished while operating at a minimum input of power. Further, operation in this optimized power and pressure regime results in the prevention of gas phase polymerization and powder formation. While the use of low pressure and minimum power provides for the deposition of the highest quality material yet reported for microwave glow discharge processes, that process still suffers from an inability to control the specific activated species generated within the plasma.

The two main points to bear in mind when discussing either the aforedescribed r.f. plasma glow discharge deposition methodology or the improvement thereover provided by the aforementioned low pressure microwave initiated glow discharge deposition methodology is that (1) in both of these plasma processes, material quality deteriorates relative to increases in the rate of deposition, and (2) it is impossible to control the kinetics of the gas phase chemistry in such a manner that the only species generated in the glow discharge plasma will be those species which, when deposited onto a surface of the substrate, will fabricate the highest possible quality of thin film material.

In contrast thereto, it should be appreciated that if it were possible to control plasma chemistry, it would be possible to generate only the desired free radical or ionic species, and it would therefore be possible to deposit only the highest possible quality of thin film material. Further, in view of the fact that only desired free radical or ionic species are generated in the plasma, the material can be deposited at very high rates because it no longer is necessary to be sure that the dangling, broken, bent, strained, stressed, or other deviant bonding configurations of the host matrix of the depositing material have a chance to be healed through the use of such compensating elements as hydrogen and/or fluorine.

It is to be specifically noted that the instant inventors are not claiming to be the first to have considered the possibility of depositing only specific metastable free radical or ionic species from which it is possible to fabricate a thin film of the highest possible quality; however, the instant inventors do believe they are the first to have invented a method of utilizing gas phase plasma kinetics in order to deposit the highest possible quality of thin film material by both generating only those desired free radical or ionic species from a gaseous precursor mixture and then depositing those desired free radical or ionic species at a very high, and hence commercially significant rate of deposition (i.e., orders of magnitude higher than the rate obtainable by employing microwave initiated glow discharge deposition for the same quality material).

In the following paragraphs, the instant inventors intend to describe the present state of the art of depositing thin film materials from only desired precursor species by processes generally known as "remote plasma excitation". The term "remote plasma excitation", as used herein, refers to a process by which a gaseous precursor mixture is formed into a plasma of desired species at one location of a vacuumized chamber and those desired species are then deposited at a location of said chamber remote from the point of plasma formation. The reader's attention is specifically directed to the efforts the two most respected scientists in field of remote plasma excitation, Drs. G. Lucovsky and I. Shimizu. Dr. Lucovsky, at North Carolina State and Dr. Shimizu at the University of Tokyo have conducted research directed toward the deposition of specifically preselected free radical species from a silicon-based plasma in order to obtain a silicon alloy film characterized by a low density of localized defect states in the energy gap thereof, excellent photoconductivity (the ratio of light to dark conductivity) and long charge carrier lifetimes (It is to be noted that the improvement in each of these parameters is to be compared to thin films of silicon alloy material deposited from r.f. or microwave initiated plasmas.).

The currently relevant commercial deposition techniques which have been discussed in detail hereinabove can be generally characterized as "direct plasma enhanced chemical vapor deposition" processes. As used herein, "direct plasma enhanced chemical vapor deposition" will refer to a process by which a gaseous precursor mixture, containing the desired deposition species, is directly exposed to a source of excitation or fragmentation energy and the deposition species thereby created are deposited onto a substrate proximately disposed relative thereto. The most common example of such direct excitation processes are r.f. or microwave initiated glow discharge excitation of silane and hydrogen to deposit a thin film of hydrogenated amorphous silicon alloy material onto a surface of a contiguous substrate.

While these direct plasma techniques have proved to be quite useful, and indeed have become the "Standard" in terms of amorphous semiconductor device fabrication, they are relatively slow in terms of deposition rate (i.e., on the order of under 15 Angstroms per second) and improvement in the quality of deposited material is still required. Further, when direct excitation plasma techniques are employed, the heat and intensity of the processes make it impossible, or at least exceedingly difficult, to utilize heat or energy sensitive substrates, such as many synthetic plastic resins or printed circuit boards. As previously discussed, in an effort to increase the deposition rate of those films, higher energy levels have been employed. These higher energy levels, however, have resulted in the aforementioned undesirable consequences. Specifically, higher power direct plasma excitation changes the kinetics of the gas phase plasma reactions so as to generate precursor species which introduce deleterious bonding sites into the depositing film. This, of course, results in the deposition of thin film material exhibiting inferior electronic and optical properties (in terms of semiconductor alloy material) as compared to lower power deposition techniques.

Prefatory to the description of the prior indirect excitation work of others, it must be noted that, as used herein, the term "activated species" will refer to microscopic objects which carry internal energy, whether atomic or molecular, free radicals, ions, or excited neutrals. This definition is to be contrasted with the use of the term by Dr. Lucovsky who believes that metastable, excited or non-ground state helium (He*) is generated when the energy transferring gas is exposed to the electromagnetic field. In contradistinction thereto, the instant inventors believe that the activated species are actually helium ions (due to an experimentally observed magnetic field dependency of the thin film deposition rate). However, the nature and characterization of those activated species is not critical to the operation of the method of the instant invention. Therefore, it is to be understood that the term "activated species" will refer generically to any of such activated species.

It must further be noted that the term "activation region" or "plume of activated species", as used herein, will refer to that volume of the evacuated enclosure in which the number of activated species which are generated by the electromagnetic field exceeds the number of activated species which are extinguished due to wall loss, collisions, etc.

In an attempt to remedy the shortcomings of high power direct plasma excitation, the two aforementioned groups of researchers (G. Lucovsky, et al at North Carolina State University and I. Shimizu, et al at Tokyo Institute of Technology) have conducted research aimed at developing non-direct plasma excitation processes wherein the deposition species are formed remotely of the plasma region. These non-direct plasma excitation processes involve; (1) the excitation of a first gaseous precursor (typically a noble gas), within a structurally confined (walled) activation region, to an activated species; (2) the transport of the activated metastable species from the structurally confined activation region, which is accomplished by allowing the activated species to "drift" from that activation region to a deposition region; (3) the downstream collision of the activated species with a precursor deposition gas, whereby the activated species and the precursor deposition gas collide and interact to form some desired deposition species; and (4) the deposition of a thin film of material from those deposition species onto a substrate operatively spaced therefrom.

Lucovsky, et al (see the Journal of Non-Crystalline Solids, 12th ICALS, Prague, 1987 for a paper by Lucovsky and Tsu entitled "Differences Between Direct And Remote Plasma Enhanced CVD") teach the deposition of a thin film of amorphous silicon: hydrogen material by employing r.f. energy (13.56 MHz) from which to generate a structurally confined activation region of excited helium atoms (such as helium free radicals, He*), which activation region is spacedly disposed from a heated substrate by at least 10 cm. The excited helium free radicals then migrate from the plasma region to interact with neutral silane gas (diluted with 90% argon), which silane gas is introduced above the heated substrate by a "showerhead" gas ring. Dr. Lucovsky claims that the He* atoms collide with the $SiH_4$, resulting in the creation of deposition free radical species of the silane as given by the following reaction:

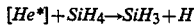
$$[He^*] + SiH_4 \rightarrow SiH_3 + H$$

In other words, the thermodynamics and collision kinetics of helium metastable species with silane neutrals is of the correct energy to favor the formation of $SiH_3$, which $SiH_3$ free radical is believed by scientists to provide the highest quality silicon alloy material. The reaction products ($SiH_3$ and H) are specific silane fragments which undergo a chemical vapor deposition reaction on the exposed surface of the heated substrate. The noble gas atom, argon, has also been used in place of helium as the r.f. plasma activated metastable species. However, as reported from work done by Matsuda, et al, and confirmed by Lucovsky, argon initiates a different fragmentation of the silane, thereby causing plasma polymerization of $SiH_2$ and silane to disilane, trisilane, etc. The result is the creation of large amounts of polysilane powder as well as the deposition of the silicon alloy film.

These remote plasma excitation processes have also been employed for the deposition of thin films of silicon oxide ($SiO_x$) and silicon nitride ($SiN_x$) dielectric or insulating material. In the deposited dielectric films, the plasma of activated species typically include about 20% $O_2$ or $N_2$ in He, depending upon the desired composition of the film to be deposited. These activated species are then excited by an r.f. plasma so as to generate excited $(O_2, He)^*$ or a $(N_2He)^*$ metastable species. These activated metastable species then interact with $SiH_4$ (or other silicon-containing gas) as represented by the following unbalanced equations:

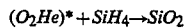
$$(O_2He)^* + SiH_4 \rightarrow SiO_2 \qquad \text{I.}$$

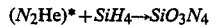
$$(N_2He)^* + SiH_4 \rightarrow SiO_3N_4 \qquad \text{II.}$$

thus depositing the thin films of silicon oxide or silicon nitride material upon the exposed surface of a heated substrate.

Both of the aforedescribed thin films of dielectric materials and the thin films of semiconductor alloy materials are fabricated under substantially similar deposition conditions. More specifically, the energy transferring gas is introduced into the enclosure at a flow rate of between about 100 and 1000 SCCM; the gaseous silane precursor is introduced into the enclosure at a flow rate of approximately 5-25 SCCM; the deposition pressure within the enclosure is maintained at between about 300 mtorr and 1 torr; the applied r.f. power is maintained at about 5–50 watts; and the substrate temperature is maintained at about 40° to 400° Centigrade. These operating parameters, particularly the flow rates of both the energy transferring gas in the first conduit and the background pressure in the enclosure are considered necessary so that: (1) the diffusion of silane gas back into the structurally confined activation region is substantially minimized; and (2) an acceptable density of the activated species from the energy transferring gas is extracted from the structurally confined activation region and directed towards the silane gas dispersal ring.

It is very noteworthy that the aforementioned preferred flow rates and background pressure assure a mean free path for bimolecular collisions of a fraction of a millimeter, while the substrate is spacedly disposed approximately 5 centimeters from the collision region, i.e., the region in which, for instance, metastable He species, metastable $O_2$ species and $SiH_4$ molecule collide. This spatial arrangement was selected to guarantee that a plurality of localized collisions between the aforementioned metastable species and the silane molecules would occur before the material was deposited onto the surface of the heated substrate. However, the combination of pressure and mean free path at that pressure ensures that multiple collisions will occur prior to deposition and therefore that the depositing material will include many different species as opposed to the single desired species. Additionally, the multiple collisions prevent a high density of the single desired species from being deposited onto the substrate. It is no wonder that the deposition rate of desired free radical species remains so low.

Turning now to the work of Dr. Shimizu, a modified process for semi-direct plasma excitation is described in a paper entitled "Growth Of Amorphous And Crystalline Silicon By HR-CVD (Hydrogen Radical enhanced CVD) authored by Shibata, Fukuda, Ohtoshi, Hanna, Oda and Shimizu and published in Materials Research Symposium Proceedings, Volume 95, 1987, pp. 225–235. In this paper Shimizu, et al propose a novel technique for the preparation of Si-based alloys. It is important to recognize the fact that the Shimizu, et al technique employs "hybrid excitation" in which the precursor deposition is both directly and remotely activated. The direct excitation occurs through direct exposure to the electromagnetic field and the remote excitation occurs as a product of interaction of the partially excited deposition species with the activated metastable species of the energy transferring gas. In the described HR-CVD technique, it is essential that the precursor deposition gas be struck by activated species of an energy transferring gas to secondarily form $SiF_nH_m$ (where n+m is less than 3).

The apparatus of Shimizu, et al includes coaxial tubes, in the interior one of which $SiF_4$ is transported and in the exterior one of which hydrogen gas and argon gas transported. The hydrogen gas is converted to atomic hydrogen through the direct exposure to a source of microwave energy. A second interconnected portion of the apparatus is a stainless steel deposition chamber in which a heated substrate is disposed. The $SiF_4$ is first directly exposed to the microwave energy in the interior tube and is secondarily exposed to the hydrogen plasma at the end of the inside tube to generate the deposition species. Typical deposition parameters are a $SiF_4$ flow of 45 SCCM, an Ar flow of 76 SCCM, an $H_2$ flow of 10 SCCM, a power of 440 watts at 2.45 GHz, and a background pressure of 300 millitorr. Not surprisingly, Shimizu, et al found that the location of the exit of the inside tube as well as the distance thereof from the substrate are important factors in determining the rate of deposition as well as the quality of the deposited film. Further, Shimizu, et al reported the presence of a negligible number of ionic species of the precursor deposition gas and therefore concluded that the free radical species of the precursor deposition gas formed the depositing species. Finally, note that Shimizu, et al obtain a rate of deposition of no more than 50 Angstroms per second; however, this relatively high deposition rate was due to the direct excitation of the precursor deposition gas. While this direct excitation resulted in drastically improved rates of deposition, the ability to control the nature of the depositing species and therefore the ability to maintain high electronic film quality was thereby forfeited.

Despite the extensive research conducted by the two above mentioned groups of Drs. Lucovsky and Shimizu, the goal of depositing high quality thin films at relatively high deposition rates (vis-a-vis, r.f. deposition quality and rates) has gone unfulfilled. Indeed, the truly remote plasma excitation processes thus far developed are capable of deposition rates of only about 0.1 to 5 Angstroms per second of intrinsic amorphous silicon alloy material characterized by a density of defect states on the order of approximately $10^{16}$ to $10^{17}$ defects per $cm^{-3}$ per eV. Thus, it should be appreciated that the deposition rate of high electronic quality thin film amorphous silicon alloy material remains far below a rate which would be recognized as a commercially significant improvement over prior art processes.

Ironically, the inventors of the present invention have found that the parameters which earlier researchers deemed critical, (i.e., the flow rates of both the precursor deposition gas (such as $SiH_4$) and the energy transferring gas (such as He), the background pressure in the enclosure and the spacing of the substrate relative to the activation region (the region in which the energy transferring gas is activated) have been erroneously selected to prevent the rapid deposition of high quality thin film material. While the spaced disposition of the activation region from the substrate is certainly effective in preventing back diffusion of precursor deposition species, such as silane, into the plasma of activated species; (1) the length of this "drift zone"; (2) the background pressure existing within the enclosure; and (3) the necessity of structurally enclosing (as with walls) the activation region, causes the density of He* species to rapidly decline as the distance from the plasma region increases. This distance can be increased to such an extent that an insufficient number of activated species arrive at the collision region to exhaust (collide with) 100% of the precursor deposition gas. Additionally, the length of the "drift zone" and the structural confinement of the activation region allows for an excessive number of He*—He* collisions and He* to wall collisions, which collisions reduce the number of metastable He available for interaction with the deposition precursor gas. Of course, as the number of collisions between the activated species of the energy transferring gas and the precursor deposition gas decrease, the number of deposition species available correspondingly decreases and the deposition rate drops.

Therefore, it has been demonstrated that prior art remote excitation techniques realized it was necessary to (1) generate a high flux of activated species of an energy transferring gas; (2) transport a high number of those activated species from the activation region to the collision region by limiting the deactivation of activated species through events such as (a) activated species intercollisions, (b) activated species-wall collisions, and (c) the proximate disposition of the collision region relative to the activation region; (3) prevent the back diffusion of the precursor deposition gas from the collision region into the activation region (at which region direct excitation thereof would occur); and (4) prevent multiple collisions between the deposition species and all other molecules, atoms, electrons, particles or other species, whereby only desired deposition species are deposited onto the substrate. However, all known prior art remote excitation techniques have been unable to accomplish these objectives. As will become apparent from the sections of this specification which follow hereinafter, only by providing the ability to independently control each one of the four aforementioned objectives is it possible to deposit high quality films of a given composition at an optimized rate of deposition.

BRIEF SUMMARY OF THE INVENTION

In contrast to all of the aforementioned prior art relating to the remote deposition of thin films through the generation of only desired free radicals or other depositing species, whether through the utilization of r.f. or microwave plasmas, such as the work of Drs. Lucovsky and Shimizu; in one embodiment, the instant invention not only provides for the creation of only desired energized deposition species from a precursor deposition gas, such as silane; but in a preferred embodiment, the instant invention also provides the ability to independently control each of the four parameters critical to the remote deposition of those desired species so as to obtain a high quality film at a commercially meaningful, heretofore unobtainable, rate of deposition, (i.e., significantly higher than the rate of deposition possible with r.f. or microwave plasma processes).

More specifically, there is disclosed herein a method of: (1) generating the highest possible number of activated species, through the use of an intense microwave initiated glow discharge plasma; (2) transporting the activated species to the collision region, without losses occasioned by either wall or activated species collisions (through the use of a substantial pressure differential and the elimination of structural confinement of the activation region); (3) preventing the back diffusion of the precursor deposition gas from the collision region to the activation region (through the use of the substantial pressure differential and transonic velocity of the energy transferring gas in the first conduit); and (4) preventing multiple collisions of the energized deposition-/etchant species with all other particles (through the use of an optimized background pressure to establish a desired mean free path). It is further to be noted that the use of the aforementioned transonic velocity further serves to impart directional momentum to the activated species of the energy transferring gas which enables those activated species to travel the distance from the activation region to the collision region within 100 micro-seconds, i.e., the lifetime of the activated ionic species of the energy transferring gas at the background pressure of 5-10 millitorr.

There is disclosed herein a method of generating a high flux of activated species from an energy transferring gas. The method comprises the steps of providing an enclosure, maintaining the interior of said enclosure at sub-atmosphere background pressure, introducing an energy transferring gas into the interior to said enclosure through at least one aperture formed in a first conduit at a pressure which creates a pressure differential between the pressure of the energy transferring gas in said first conduit and the background pressure sufficient to activate a high flux of activated species of said energy transferring gas in an activation region, and operatively disposing a substrate interiorly of the enclosure and spacedly located remote from the activation region. In this matter a high flux of activated species are adapted to react with the surface of the substrate.

The flow rate of the energy transferring gas in the first conduit is selected so as to provide a sufficient pressure of energy transferring gas adjacent the aperture for initiating a plasma from the energy transferring gas at a power-pressure-aperture size regime which is at the substantial minimum of the Paschen curve. The size of the aperture may be reduced relative to the size of the first conduit so as to form a choke adjacent the aperture for providing the high pressure of said energy transferring gas. The time of residency of the energy transferring gas adjacent the aperture may be increased, as by a magnetic field, so that the pressure of the energy transferring gas adjacent the aperture is also increased. A cooling mechanism, such as a water jacket may be provided for the first conduit. A protective sleeve, such as a graphite sleeve, is provided by which degradation of the surface of the first conduit adjacent the aperture is reduced. The energy transferring gas is selected from the group consisting of, but not limited to hydrogen, the noble gases, $CH_4$, $CF_4$, and combinations thereof.

In one preferred embodiment, the further step of forming a high number of activated species from the energy transferring gas is specified for etching material from the surface of said substrate. In a second preferred embodiment, the high density of activated species are utilized to deposit material onto the surface of the remotely located substrate.

A further step may be employed by which a precursor deposition gas is introduced into the interior of the enclosure through a second conduit, the point of introduction of said precursor deposition gas from said second conduit into the enclosure is spacedly disposed relative to the activation region. In this manner collisions of the high number of activated species with said precursor deposition gas define a collision region in which a high density of energized deposition species of the precursor deposition gas is generated. The precursor deposition gas is selected so that, upon collision of the activated species of said energy transferring gas therewith, one or more desired deposition species of the precursor deposition gas will be formed. The precursor deposition gas is selected from the group consisting essentially of a silicon-containing gas, a carbon-containing gas, a germanium-containing gas, and combinations thereof.

An embodiment is disclosed wherein the energy transferring gas and the precursor deposition gas are selected so that upon collision of the precursor deposition gas and the the activated species of energy transferring gas, one or more desired combination species will be formed. Therefore, the energy transferring gas may be selected to further include one or more gases from the group consisting essentially of $O_2$, $NH_3$, $N_2$, $NH_4$, $CH_4$, $PH_3$, $PH_5$, $BF_3$, $BF_5$, $B_2H_6$, $BH_4$, and combinations thereof.

Either r.f. or microwave frequency may be utilized to activate the energy transferring gas. When microwave energy is employed, a radiant microwave applicator is utilized to activate the energy transferring gas flowing through the aperture in the first conduit. The first conduit may be formed from a microwave transmissive material and the aperture portion thereof disposed within the radiant microwave applicator so that the activated species are primarily initiated interiorly of said first conduit. Alternatively, the first conduit may be formed from a material not transmissive to microwaves so that the activation species are primarily initiated exteriorly of the first conduit.

As mentioned hereinabove, an electromagnetic field is applied to form the plume of activated species, the volume of the plume being controllable by controlling the pressure differential which exists between the background pressure in the enclosure and the pressure of the energy transferring gas adjacent said aperture in the first conduit.

The background pressure in the enclosure is preferably maintained in the range of less than 50 torr. A flow rate of at least about 10 SCCM of the precursor deposition gas is preferably introduced to flow through the second conduit and into the enclosure. A flow rate of at least about 100 SCCM of energy transferring gas is preferably introduced to flow through the first conduit and into the enclosure. In this manner, pressure isobars are maintained adjacent the aperture portion of the first conduit of about one half the pressure at which the minimum of the Paschen curve for a given gas occurs. It is also preferred that the substrate is disposed a distance from the collision region of less than the length of the mean free path of the energized deposition species. Preferably, the flow rate of the energy transferring gas through the first conduit relative to the background pressure which exists in the enclosure is selected to impart a velocity to the activated species of the energy transferring gas of at least about the same magnitude as the thermal velocity thereof so that the activated species are imparted with a directional velocity toward the collision region. To most effectively impart such a velocity, it is necessary that the flow be substantially transonic (near the velocity of sound so as to operate in a choke mode).

In a second major embodiment of the instant invention, there is disclosed a method of generating a high flux of activated species from an energy transferring gas. The method includes the steps of providing an enclosure, maintaining the interior of the enclosure at sub-atmospheric background pressure, introducing energy transferring gas into the interior of the enclosure through at least one aperture formed in the first conduit, activating the energy transferring gas in an activation region so as to form a high flux of activated species from the energy transferring gas, operatively disposing a substrate interiorly of the enclosure and spacedly located relative to the activation region, and limiting, without structural confinement, the volume occupied by the plume of activated species to a volume less than the volume occupied by the applied electromagnetic field. In this manner, a high flux of activated species are adapted to react with the surface of the substrate.

In a third major embodiment of the instant invention, there is disclosed a method of fabricating high quality films at a relatively high rate of deposition. The method includes the steps of providing an enclosure, maintaining the interior of the enclosure at sub-atmospheric background pressure, introducing an energy transferring gas into the interior of the enclosure through at least one aperture formed in a first conduit, activating the energy transferring gas in an activation region so as to form a high flux of activated species from the energy transferring gas, and introducing a precursor deposition gas into the interior of the enclosure through a second conduit. The point of introduction of the precursor deposition gas from the second conduit into the enclosure is spacedly disposed relative to the activation region, whereby collisions of the high flux of activated species with the precursor deposition gas so as to form a collision region in which a high density of energized deposition species are generated. The method further includes the steps of operatively disposing a substrate interiorly of the enclosure for depositing energized deposition species of the precursor deposition gas thereupon, the substrate being spacedly positioned from the activation region a distance sufficient to substantially prevent electron damage to the depositing deposition species and microwave degradation of the substrate, and maintaining a substantial pressure differential between the pressure of energy transferring gas in the first conduit and the background pressure in the enclosure. The pressure differential must be sufficient to activate a high flux of activated species of said energy transferring gas so that high quality thin film material of desired deposition species is deposited onto the substrate at a rate greater than about 5 Angstroms per second.

In a fourth major embodiment of the instant invention, there is disclosed a method of fabricating high quality films at a relatively high rate of deposition. The method includes the steps of providing an enclosure which is maintained at sub-atmospheric background pressure, introducing an energy transferring gas into the said enclosure through at least one aperture formed in a first conduit, applying an electromagnetic field to the energy transferring gas in an activation region so as to form a plume of activated species, introducing a precursor deposition gas into the enclosure through a second conduit which is spaced from the activation region, whereby collisions of activated species with the precursor deposition gas define a collision region in which a high density of energized deposition species of the precursor deposition gas are generated, and operatively disposing a substrate in the enclosure for depositing energized deposition species adjacent the collision region thereupon. The improvement in the method includes the step of limiting, without structural confinement, the volume occupied by the plume of activated species to a volume which is less than the volume occupied by the electromagnetic field. In this manner, a high quality of thin film material of only desired deposition species is deposited onto the substrate at a high rate of deposition.

In a fifth embodiment of the instant invention there is disclosed a method of generating a high flux of ionic species from an energy transferring gas and using said ionic species to reactively etch material from a remotely positioned substrate. The method comprises the steps of providing an enclosure, maintaining the interior of the enclosure at a preselected sub-atmospheric background pressure, introducing an energy transferring gas into the interior of the enclosure through at least one aperture formed in a first conduit, activating the energy transferring gas in an activation region so as to form a plume of ionic species of the energy transferring gas, operatively disposing a substrate interiorly of the enclosure and spacedly positioned relative to the activation region, and controlling the flow of the energy transferring gas in the first conduit so that the pressure adjacent the aperture is at least about a factor of five times greater than the preselected background pressure. In this manner a high flux of ionic species reactively etch material from the exposed surface of the substrate.

In a final embodiment of the instant invention, there is disclosed a method of generating a high flux of activated species from an energy transferring gas. The method includes the steps of providing an enclosure, maintaining the interior of the enclosure at a sub-atmospheric pressure, introducing an energy transferring gas into the interior of said enclosure through at least one aperture formed in a first conduit, activating said energy transferring gas in an activation region so as to form a plume of activated species from said energy transferring gas, and establishing a flow of said energy transferring gas through said first conduit at substantially transonic velocity. In this manner, there is defined a clear boundary of said activation region, without structural confinement.

The above-described and other objects, advantages and features of the instant invention will become more apparent upon reference to the Drawings, the Detailed Description Of The Drawings, the Claims which follow hereinafter.

DETAILED DESCRIPTION OF THE INVENTION

I. THE REACTION APPARATUS

Figure 1:
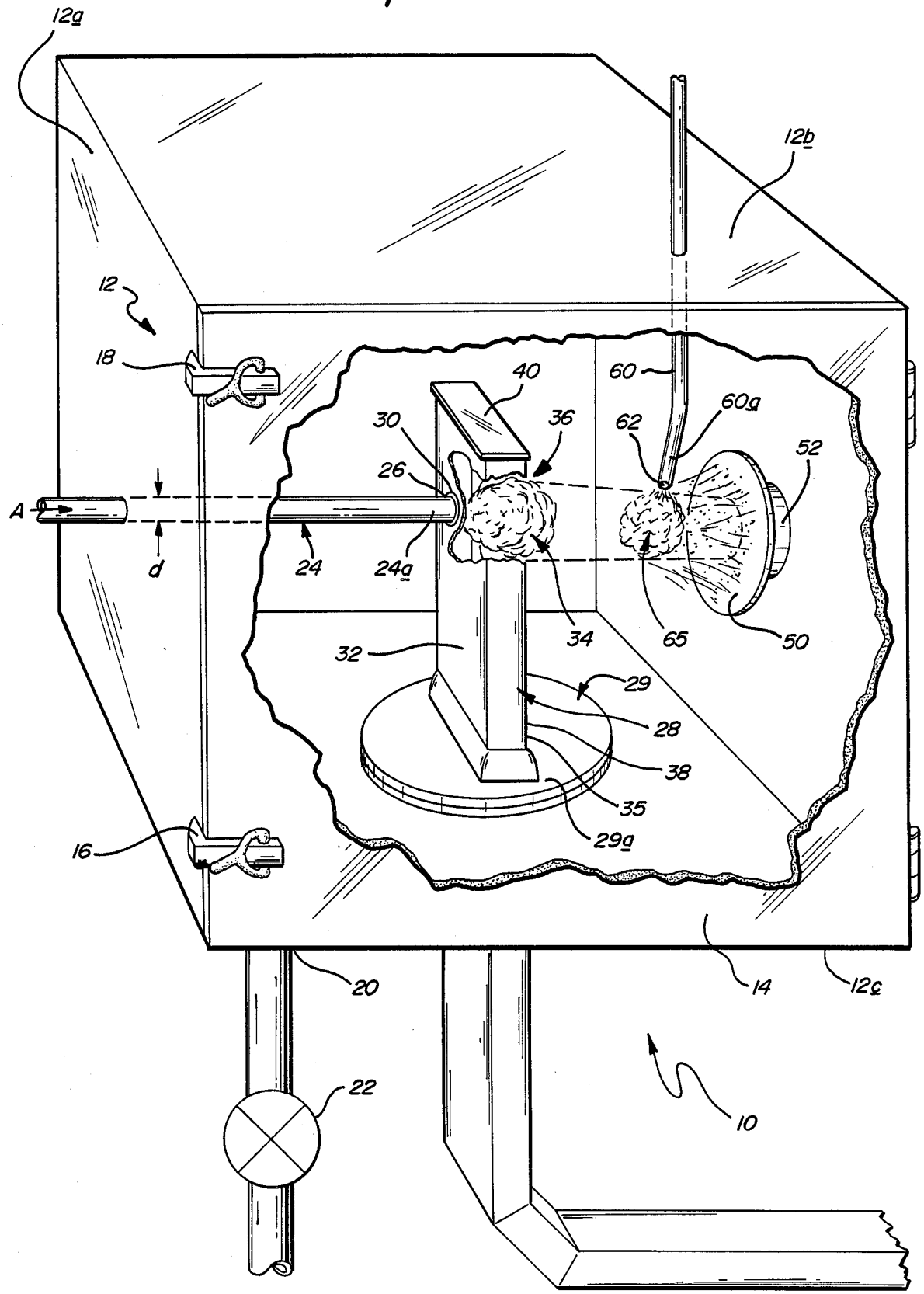
FIG. 1 is a perspective view, partially cut-away, illustrating the interior of the vacuumized enclosure of the instant invention, in which enclosure a plume of activated species of an energy transferring gas is directed to collide with a precursor deposition gas for the generation of energized deposition species and the deposition of those deposition species onto the surface of a remotely positioned substrate.

Referring now to the drawings and particularly to FIG. 1, there is illustrated therein a perspective view, partially cut-away, of a reaction apparatus, generally referenced by the numeral 10. Functionally, the apparatus 10 is adapted to generate a plume of activated species from an energy transferring gas introduced into the interior thereof. The activated species of the energy transferring gas may then be energetically directed towards a region populated by a high density of a precursor deposition gas, whereby activated species of the energy transferring gas collide with the precursor deposition gas so as to form desired energized deposition species. These energized deposition species will subsequently deposit relatively high quality, thin film layers of silicon, germanium, carbon and combinations thereof, upon a substrate operatively disposed in proximate relationship to the collision region. Alternatively, the precursor deposition gas may be a precursor etchant gas which, upon collision with the activated species of the energy transferring gas, yields an activated etchant species capable of quickly and efficiently etching the exposed surface of that substrate.

The apparatus 10 as depicted in FIG. 1, includes a generally rectangularly shaped, hollow, vacuumizable enclosure 12. The enclosure 12 includes a pivotable front face 14 which functions as a door 14 for loading and removing substrates from the interior of the enclosure. The inner periphery of the door 14 is equipped with one or more vacuum seal rings (not shown) and one or more latches, such as 16 and 18, which latches are adapted to compress the seal rings for assuring an airtight closure between ambient conditions externally of the enclosure and vacuum conditions interiorly of said enclosure. The vacuumized enclosure 12 further includes a pump-out port 20 in the bottom wall 12c thereof adapted for connection to a powerful vacuum pump 22 which is employed to: (1) exhaust depleted reaction products from the hollow interior thereof; and (2) to maintain the interior of said enclosure 12 at an appropriate sub-atmospheric pressure. As will be explained in greater detail hereinafter, the background pressure will be carefully selected to initiate and sustain the high rate deposition or etchant process carried out interiorly of the enclosure.

The apparatus 10 further includes at least a first elongated conduit 24 of diameter d, wherein d is preferably between about 0.5 to 3.0 cm, extending through a side wall 12a into the interior of said vacuumized enclosure 12. The first, hollow conduit 24 includes at least one portion, the distal end portion 24a thereof, having an aperture 26 formed therein. The first conduit means 24 and the aperture portion 24a thereof are adapted to, respectively, transmit and introduce an energy transferring gas from a source (not shown) into the interior of said vacuumized enclosure 12, preferably to a point immediately adjacent apparatus adapted to provide activated species from said energy transferring gas. In the preferred embodiment depicted in FIG. 1, the activation apparatus will take the form of a radiant microwave applicator 28, discussed in greater detail hereinbelow. In one preferred embodiment, the first conduit 24 is adapted to introduce an energy transferring gas selected from the group consisting essentially of hydrogen ($H_2$), methane ($CH_4$), the noble gases and combinations thereof. Alternatively, and in another preferred embodiment, the above mentioned energy transferring gases may also include one or more diluent or dopant gases, including, but not limited to, $O_2$, $N_3$, $NH_2$, $NH_4$, $CH_4$, $PH_3$, $PH_5$, $BF_3$, $BF_5$, $B_2H_6$, $BH_4$, and combinations thereof.

Regardless of the composition of the energy transferring gas employed, the aperture 26 formed at the distal end of the first conduit 24 must be capable of delivering a selected flow rate (as measured in terms of SCCM, i.e., standard cubic centimeters per minute) of said energy transferring gas. The flow rate is selected to provide a sufficient pressure of the energy transferring gas adjacent said aperture 26 for initiating the activation of said energy transferring gas at a power-pressure aperture size regime which is at the substantial minimum of the modified Paschen curve, (the details of the Paschen curve will be discussed hereinafter with respect to FIG. 4).

Figure 2:
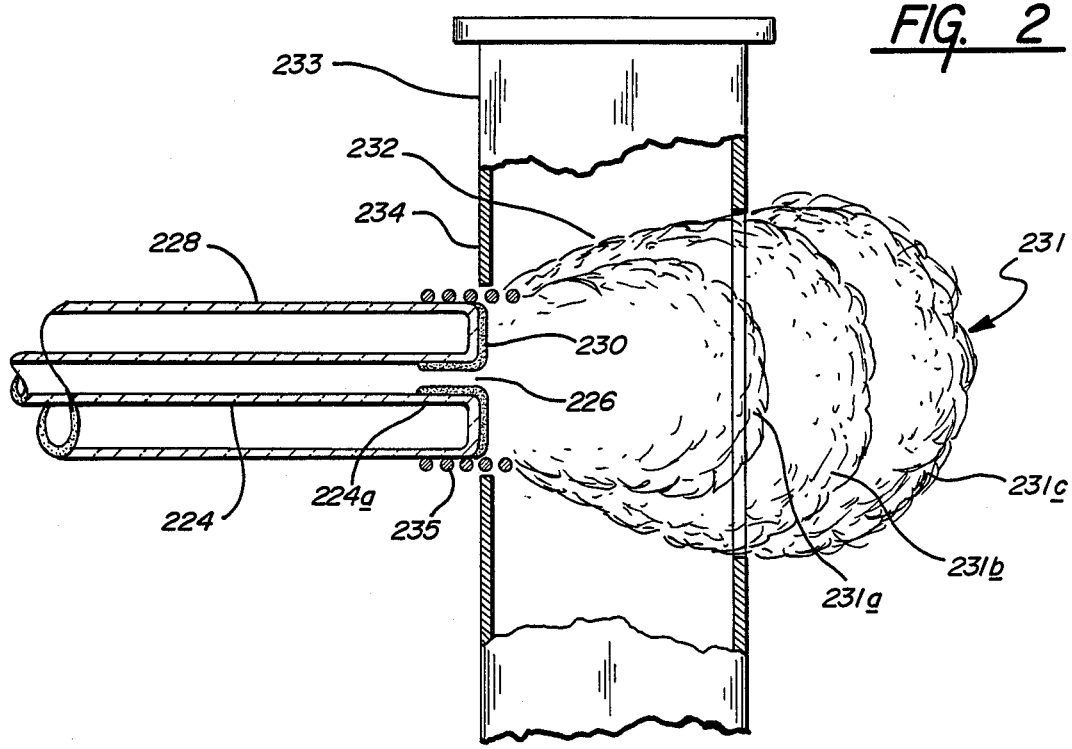
FIG. 2 is an enlarged, cross-sectional side view, partially cut-away, illustrating the position of the first conduit, through which the energy transferring gas is introduced into the enclosure, relative to the microwave applicator.

The first conduit 24 may further include means for reducing the diameter thereof adjacent said aperture 26, which reducing means may, in one embodiment, simply take the form of an overcoat 230 as depicted in FIG. 2. By so reducing the flow path for the energy transferring gas, it is possible to create a "choke condition" in the first conduit 24 adjacent the aperture 26 so as to provide a localized high pressure of the energy transferring gas. As used herein, the term "choke condition" refers to the condition which occurs when the speed of the energy transferring gas passing through the aperture 26 in the first conduit 24 reaches transonic speed. The choke condition generally is that condition which occurs in compressible gas (or fluid) flow when, for a conduit of a uniform size, the speed of the gas passing through said conduit reaches transonic velocity. It is at this condition that any rise in the flow rate of the energy transferring gas results in an increase in pressure rather than velocity. It is also this condition which defines the choke mode and it is precisely this effect which allows the pressure to be increased for operation at the substantial minimum of the Paschen curve. This localized high pressure creates a sufficient pressure zone for the energy transferring gas flowing through the first conduit adjacent the aperture portion 24a so that a plasma may be initiated and maintained at a power level which can be independently controlled. In an alternative embodiment, the pressure within the aperture portion 24a of the first conduit 24 may be easily controlled by employing a solenoid therewithin, which solenoid may be selectively constricted or relaxed so as to regulate the flow rate of energy transferring gas passing therethrough and hence the pressure which exists adjacent said aperture portion 24a.

The first conduit 24 may also include a coil, such as 235 depicted in FIG. 2, wrapped thereabout for providing an applied magnetic field immediately adjacent the aperture portion 24a. The applied magnetic field can be energized to increase the residence time of the activated species of the energy transferring gas in a plasma zone which is created immediately adjacent the aperture 26 of the first conduit 24. As will become more apparent from the description which follows hereinafter, the magnetic field established by the coil 235 serves to confine the plasma of ionized species created by the microwave applicator to the immediate vicinity of the distal aperture portion of the first conduit. In this manner, a varying magnetic field can be utilized to control the density of ionized species which can be directed for downstream collisions.

Figure 3:
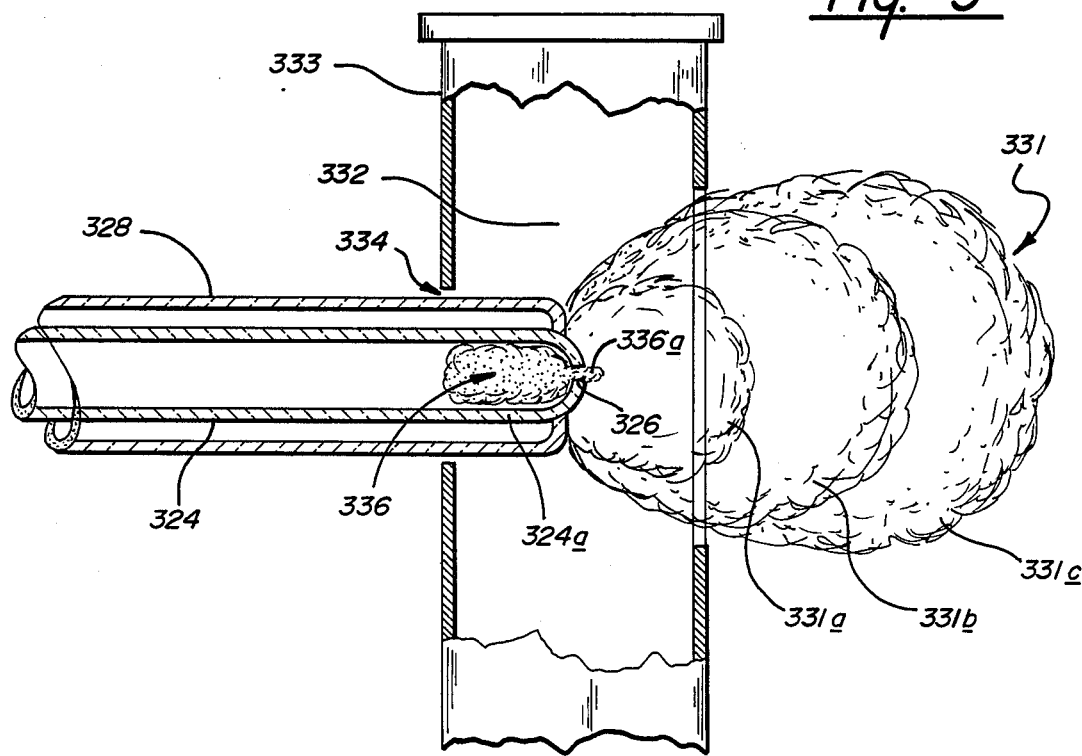
FIG. 3 is an enlarged, partially cut-away side view of the first conduit and microwave applicator depicted in FIG. 2, said conduit modified to extend approximately half way into the interior of said applicator.

Turning now in greater detail to FIGS. 2 and 3, there is illustrated therein two preferred, modified embodiments of the first conduit 24 discussed with respect to FIG. 1. FIG. 2 specifically depicts a first preferred embodiment, wherein the first conduit 224 is fabricated from a material which is not microwave transmissive, such as stainless steel or a like microwave reflecting metal. As in the FIG. 1 embodiment, the first conduit 224 includes at least one portion, the distal end portion 224a thereof, having an aperture 226 formed therein. The non-transmissive first conduit 224 also includes an external, concentrically disposed cooling jacket 228 wrapped thereabout, which jacket is adapted to facilitate the circulation of a cooling medium, such as water, therethrough. In this manner, the cooling jacket 228 is able to maintain said first conduit 224 at a uniform, relatively low temperature despite the intense heat generated by the highly energetic, activated species created at said distal end of said conduit by, for instance, microwave energy or r.f. electromagnetic fields. Aside from water, the cooling medium may also be selected from the group of fluids consisting essentially of silicone oil, freon, nitrogen, hydrogen, helium, and other cooling media well known to those ordinarily skilled in the art.

More particularly, the cooling jacket 228 is necessitated due to the heat which is generated by the intensity of the activation region initiated and sustained adjacent said aperture 226 at the distal end of said conduit. Note that the energy transferring gas effusing from said aperture 226 of the first conduit 224 is subjected to the intense electromagnetic field created by the microwave energy transmitted through the radiant microwave applicator 232. The intense electromagnetic field disassociates the energy transferring gas. It is the subsequent chemical reaction of disassociated species which liberates heat resulting in the build-up of very high temperatures as well as the formation of a highly reactive plasma of activated species of the energy transferring gas. Accordingly, the aperture portion 224a and the first conduit 224 reach temperatures sufficient to melt the material from which the first conduit is fabricated. If not for the presence of the cooling jacket 228, this material would decompose due to the extremely high temperature conditions and become a source of contaminants within the vacuumized enclosure. These contaminants would ultimately degrade the quality of the plasma activation process due to the deposition of contaminated material onto the substrate.

The first conduit 224, depicted in FIG. 2, further has affixed to the aperture portion 224a thereof the protective overcoat 230 formed of a high temperature resistant, sputter resistant, relatively benign material. This protective overcoat 230 is adapted to protect the material from which the aperture portion 224a of the first conduit 224 is fabricated, from degradation resulting from the sputtering thereof by the high temperature, highly energetic, activated species of the energy transferring gas.

Note that, and as will be specified in detail hereinafter, the activated species of the energy transferring gas forms a plume, generally 231, of pressure isobars adjacent the aperture portion of the first conduit 224, which plume 231 defines an activation region of activated species. As will also be detailed hereinafter, the boundaries of the plume of activated species are specified by the pressure differential which exists between the gas flowing through the interior of the first conduit and the background pressure existing in the interior of the enclosure. As should be apparent, material which is sputtered from the surface of the first conduit 224 would degrade the quality of the activated species in the plume 231; and more importantly, the quality of the subsequently deposited thin film material would correspondingly deteriorate. Thus, the protective overcoat 230 is preferably fabricated from a material which is resistant to a high temperature sputtering environment; or alternatively, a material which is relatively benign when incorporated into the ultimately deposited film. In a preferred embodiment, graphite is employed as the material from which the protective overcoat 230 is fabricated. Graphite is not only highly resistant to high temperature and high temperature sputtering processes, but when the apparatus 10 is employed for the deposition of semiconductor alloy materials, graphite is substantially electrically benign to the desired characteristics of that deposited semiconductor film.

As was mentioned hereinabove, and as is more particularly illustrated in FIG. 2, the first conduit 224 is adapted to introduce the energy transferring gas flowing therethrough into the hollow interior of the activation means 232, which activation means is located immediately adjacent said aperture 226. The first conduit 224 with the concentrically disposed cooling jacket 228 wrapped thereabout are spacedly positioned adjacent an aperture 234 formed in side wall 233 of said activation means 232. The diameter of the preferably circularly shaped aperture 234 is about ¼ to one inch larger than the outer diameter of the cooling jacket 228, so as to facilitate the passage of the energy transferring gas directly into the interior of said activation means 232, while providing an adequate insulating space between the side wall 233 of the activation means 232 and the periphery of the concentrically disposed first conduit and cooling jacket so as to prevent sparking or other electrical coupling therebetween.

As should be readily appreciated from a perusal of the embodiment depicted in FIG. 2, the first conduit 224 and the cooling jacket 228 do not actually extend into the interior of the activation means 232 (which activation means, as mentioned hereinabove, is preferably a radiant microwave applicator). This is because, if the first conduit 224 were to be positioned interiorly of the hollow, rectangularly shaped applicator while the first conduit 224 and the cooling jacket 228 were fabricated of materials which were non-transmissive to microwave energy, either (1) the microwave energy would be absorbed by those materials or (2) proper coupling between the microwave energy transmitted by the applicator and the plasma would be severely deteriorated. However, since the first conduit 224 is positioned (in FIG. 2) exteriorly of, but adjacent the side wall 233 of the radiant microwave applicator 232, (1) the non-transmissive materials from which the applicator is fabricated does not interfere with plasma coupling and (2) the activated species of the energy transferring gas are primarily generated outside of the aperture 226 formed in the distal end of said first conduit 224. Further, due to the protective overcoat 230 affixed thereto, degradation of the surface material of that conduit is prevented.

Referring now to FIG. 3, there is illustrated a second preferred embodiment of the first conduit, now generally 324, with the cooling jacket 328 again concentrically disposed thereabout. As opposed to the FIG. 2 embodiment, FIG. 3 depicts the first conduit 324 and the cooling jacket 328 as fabricated from a microwave transmissive material such as quartz. It should be appreciated that the cooling jacket 328 plays a critical role in the embodiment of FIG. 3 because the first conduit 324, being formed of quartz, has a more limited ability to withstand the elevated temperatures which are generated therewithin.

The aperture 326 of the first conduit 324 is preferably reduced in diameter relative to the diameter of the remainder of the first conduit 324. Thus, the diameter of the aperture 326 is typically in the range of about one-half to one millimeter (as compared to 0.5-3 mm. for the diameter of the conduit), while the length of the channel defined by the aperture 326 is typically about one-half to two millimeters long. This restriction in the diameter of the aperture 326 is required so that the pressure of the energy transferring gas flowing through the first conduit 324 reaches the choke mode adjacent the aperture, i.e., reaches levels sufficient to insure that the energy transferring gas flows therethrough at substantially transonic velocity as that gas exits the first conduit. In this manner, the pressure at the aperture 326 can be controlled so as to operate at the substantial minimum of the Paschen curve.

The high temperature plasma region 336 is formed primarily interiorly of the conduit and will cause the chemical vapor deposition of material thereupon. As may be appreciated from a perusal of FIG. 3, in this embodiment, the first conduit 324 and the cooling jacket 328 actually extend into the hollow interior cavity of the radiant microwave applicator 332. This allows for the generation of the activated species of the energy transferring gas to occur within that first conduit 324. Thus, the cooling medium circulated through cooling jacket 328, should preferably, like the material from which the first conduit 324 and the cooling jacket 328 are fabricated, be substantially microwave transmissive. Alternatively, the difference between the outer diameters of the cooling jacket and the first conduit must be made relatively small so that the circulating cooling medium is unable to absorb too great a percentage of the microwave energy. Preferred microwave transmissive cooling media include silicone oil and freon.

While the high temperature plasma region of activated species 336 is formed primarily within the aperture portion 324a of the first conduit 324 (which plasma region is disposed inside the radiant microwave applicator 332), it is noteworthy that a tongue of plasma 336a extends beyond the aperture 326, into the interior of the radiant microwave applicator 332 and pressure isobars thereof could extend into the enclosure. The size of the tongue 336a, and the distance it extends into the applicator and enclosure is a function of the flow rate of energy transferring gas, and hence the pressure of the energy transferring gas in the first conduit. It is important to note that the tongue 336a acts as a "pilot light" which ignites and sustains the plume of the activated species 331 outside of the first conduit. This pilot light is required since the embodiment of FIG. 3 utilizes a microwave transmissive (quartz) conduit and hence must be operated at a power level of microwave energy which is relatively small, e.g., less than about 2 kilowatts. This power level, while protecting the integrity of the quartz material, would otherwise be insufficient to ignite the plume 331. The pilot light serves to provide an additional source of ions so that the power required to initiate and sustain a plasma of activated species is reduced by as much as a factor of two.

Since the aperture portion 324a of the first conduit 324 is disposed within the microwave applicator 332, the activated species of the energy transferring gas are primarily generated interiorly of said first conduit 324. Specifically, an activation region 336 is formed in that aperture portion 324a of the first conduit 324 which resides within the microwave applicator 332. Due to the highly intense energy provided by the generation of activated species within the activation region 336, the material from which the first conduit 324 is fabricated (particularly adjacent the aperture portion 326), is degradable by the gradual sputtering of the interior diameter thereof. In the event that the first conduit is fabricated of quartz, the sputtered quartz, in addition to weakening the structural integrity of the conduit 324 and increasing the size of the aperture 326, degrades the quality of the deposited thin film material. Therefore, it should be apparent that the FIG. 3 embodiment can only be employed in those instances in which the power level of microwave energy utilized is relatively small, e.g., less than 2K watts.

As is depicted in FIG. 3, the first conduit 324 and the concentrically disposed cooling jacket 328 extend through an aperture 334 formed in the side wall 333 of the radiant microwave applicator 332, so that the distal end of the first conduit may be positioned approximately half way through the hollow interior of the microwave applicator 332. Note that in this embodiment, since the first conduit 324 and the cooling jacket 328 are fabricated of dielectric material, there is no need to maintain a gap between the applicator and the outer diameter of the cooling jacket (as was true for the FIG. 2 embodiment). By such an operative disposition of the first conduit 324 relative to the microwaves transmitted within the applicator 332, the activation region effectively occurs interiorly of said aperture 326 (although the "pilot light" effect does aid in igniting the tongue of activated species exteriorly thereof).

Returning now to FIG. 1, the deposition apparatus 10 further includes the aforementioned microwave applicator 28, which applicator is adapted to deliver electromagnetic energy at 2.45 GHz to the energy transferring gas flowing through the first conduit 24. While the applicator 28 is depicted as a radiant microwave applicator, said applicator may be selected to deliver any type of energy selected from the group consisting essentially of microwave energy, r.f. energy, low frequency a.c. energy, or photo-energy in the form of a high intensity pulsed laser. However, and as previously mentioned, since microwave energy can most effectively provide a high density, large volume plasma of activated species, the applicator 28 is preferably formed as a microwave applicator, preferably a radiant microwave applicator (as opposed to slow-wave applicator) adapted to transmit at least 1.0 kilowatt of microwave power and preferably 5 kilowatts or more of microwave power at a frequency of 2.45 GHz.

As clearly depicted in FIG. 1, said applicator 28 is an elongated, hollow, generally rectangularly shaped, copper waveguide structure adapted to transmit microwave energy from a magnetron (not shown) to the energy transferring gas introduced into the enclosure from the first conduit 24. Said waveguide applicator 28 enters said enclosure 12 through a microwave transmissive window 29, which window is vacuum sealed to a bottom face 12c of the enclosure. This type of vacuum sealed window 29 is fully disclosed in commonly assigned U.S. patent application Ser. No. 179,617 filed Apr. 8, 1988, the disclosure of which is incorporated herein by reference. The microwave applicator 28 is seated upon the upper, interior plate 29a of that window 29.

In order to achieve the function of coupling the introduced microwave energy to the introduced energy transferring gas, the first conduit 24 extends through an aperture 30 formed in the side face 32 of the waveguide 28 for receiving the energy transferring gas. Therefore, the structure and function of the aperture 30 is identical to that depicted in and described with reference to FIGS. 2 and 3. Accordingly, the aperture 30 is adapted to facilitate the passage of the first conduit 24 and the energy transferring gas carried therewithin into an activation region 34 formed adjacent the aperture portion 24a of the first conduit 24 so that the plume of activated species extends from the interior of said applicator 28.

The radiant microwave applicator 28 further includes cut-away section 36 formed in the face 35 thereof opposite the face 32 in which the aperture 30 is formed. The cut-away section 36 has a diameter larger than the diameter of the aperture 30 and preferably at least about 2 inches so as to provide for the movement of expanding pressure isobars (231a-c in FIG. 2 and 331a-c in FIG. 3) of the plume of activated species without having those activated species degrade too much of the microwave applicator material. It should therefore be understood that the applicator cut-away section 36 is adapted to provide a means of directed escape for the activated species of the energy transferring gas from within said applicator 28. The microwave applicator 28 further includes a closed end plate 40 to prevent the escape of unused microwave energy into the interior of the vacuumized enclosure 12. It is to be noted that the maximum size of the cut-away section 36 of face 35 of the applicator 28 will be determined by balancing the facts that (1) the smaller the opening is made, the more material therefrom will be etched away, but the more the microwave energy is confined; while (2) the larger the opening is made, the less material is etched therefrom, but the more the microwave energy leaks into the enclosure. The cutaway section 36 may further include a microwave absorptive or reflective screen or other means adapted to prevent the microwave energy from entering the enclosure. This becomes particularly significant as the pressure differential between the background pressure and the pressure of the energy transferring gas in the first conduit is reduced to approach the aforementioned factor of at least 5.

The deposition apparatus 10 further includes at least one remotely located, generally planar substrate 50 operatively disposed within the enclosure 12 and at least spaced a distance from the activation region 34 sufficient to prevent said thin film material depositing thereupon from direct exposure to the electrons present in that region. The apparatus 10 may further preferably include means 52 adapted to heat and or apply an electrical or magnetic bias to the substrate 50. It is to be understood, however, that the use of heat or a bias is not required to practice the invention disclosed herein. In a preferred embodiment, the substrate 50 is operatively disposed so as to be substantially aligned with the first conduit 24 so that a flux of the activated species generated in the activation region 34 can be directed thereat for deposition thereupon.

In a preferred embodiment, the deposition apparatus 10 may also be equipped with a second elongated, hollow conduit 60, having at least one aperture 62 formed at the distal end 60a thereof. The apertured end 60a of the second conduit 60 extends through the top wall 12b of the enclosure 12 and into the interior thereof so that the aperture 62 terminates in close proximity to said substrate 50. The second conduit 60 is adapted to deliver a flow of a precursor deposition gas from a source (not shown) into a collision region 65 which is created adjacent said substrate 50. The precursor deposition gas is typically selected from the group consisting essentially of a silicon-containing gas, a germanium-containing gas, a carbon-containing gas, and combinations thereof. Specific examples of preferred precursor deposition gases include, but are not limited to, $SiH_4$, $SiF_4$, $Si_2H_6$, $GeH_4$, $Ge_2H_6$, $GeF_4$, $CH_4$, $C_2H_6$, and combinations thereof. Alternatively, the precursor deposition gas may be a precursor etchant gas such as $NF_3$, $CF_4$, fluorocarbons, chlorocarbons and combinations thereof.

As previously mentioned, the precursor deposition (or etchant) gas is introduced by the second conduit 60 into the collision region 65. The collision region 65 is disposed in the path of travel of the activated species of the energy transferring gas as those activated species are directed from said activation region 34 toward the substrate 50. In this manner, activated species from the activation region 34 are directed towards the collision region 64 where said species collide and interact with said precursor deposition gas so as to create a desired energized deposition species. It is to be noted that the collision region 64 should be disposed a distance from said substrate 50 selected so that the desired deposition species created in the collision region 64 will uniformly deposit over the entire surface of the substrate 50 without encountering multiple collisions with either other activated species or other deposition species formed in the collision region. In a preferred embodiment, the background pressure to which the enclosure 12 is evacuated provides for a mean free path for the free radical deposition species of approximately 1–15 cm. Therefore, by spacing the substrate a distance of 1–15 cm. from the collision region, the entire surface thereof will be covered with a uniform thin film of material. As the size of the substrate upon which thin film material must be deposited increases, the background pressure must be reduced so as to correspondingly increase the length of the mean free path. Note that since the activated species of the energy transferring gas may contain certain ionic species, which upon impact with the substrate, may be detrimental to the depositing thin film, it is possible to angle the substrate with respect to the activation region to substantially reduce the impact of the substrate with the ionic species. Note further that this angling does not reduce the rate of deposition since the mean free path of the energized deposition species is unaffected.

II. THE METHOD OF CREATING A HIGH FLUX OF ACTIVATED SPECIES

While the apparatus described hereinabove has been designed so as to be particularly adapted to carry out the principles of the instant invention, it is to be understood that other modified embodiments of this apparatus may be used with equal advantage and it is the practice of the method rather than the specific apparatus which defines the true scope of the instant invention. It will, however, be necessary to make periodic references to the aforedescribed apparatus in order to more clearly explain the practice of the operative concepts of the method disclosed herein.

In the most general terms of one embodiment of the instant invention, there is disclosed a novel method of generating a high flux and density of activated species from an energy transferring gas in an activation region which is located interiorly of the evacuated enclosure. The high flux of activated species of the energy transferring gas may then be directed to violently interact with a precursor deposition/etchant gas in a collision region so as to yield a high density of only desired energized deposition/etchant species, which energized species react with the exposed surface of a substrate spacedly located relative to the activation region. Alternatively, the high flux of activated species of the energy transferring gas may be employed to directly react upon the surface of the remotely located substrate. In either event, the novel concept of the instant invention is the ability to generate that high flux of activated species, which activated species are adapted to move to a remote location without losing their energy.

Before providing the specifics of the critical parameters which enter into the ability to practice the method of this invention, the crucial question to be asked is how the (what has been termed) "novel" remote excitation process of the instant invention differs from the remote excitation work heretofore employed by other skilled researchers in the field. The answer, which will be further expounded upon in the pages which follow, is that the instant inventors employ a significant pressure differential between the energy transferring gas flowing through the first conduit and the background pressure which exists in the vacuumized enclosure. It is this pressure differential which differentiates the work described herein from Drs. Lucovsky and Shimizu, as well as the work of all other published researchers of which the instant inventors are aware. Unfortunately, it is impossible, due to all of the deposition/etch parameters which must be considered to place a numerical value on the pressure differential which must exist in order to generate the high flux of activated species described herein; however, two simple manners of differentiating over other remote excitation processes do exist.

In the excitation process described herein and due to the pressure differential which exists, the volume occupied by the plume of activated species is not limited, without structural confinement, to the volume over which the electromagnetic energy acts in the enclosure. In marked contrast thereto, in all other remote or direct excitation processes, because the plasma region and the deposition region are maintained at substantially identical pressures, the volume occupied by the plasma of activated species of the energy transferring gas is limited by structural walls to be substantially coextensive with the volume of space occupied by the electromagnetic energy. Of course, it should be appreciated that this difference in plasma volume, vis-a-vis the volume of the electromagnetic field, is also pressure dependent to the extent that the flow of energy transferring gas is sufficient not to be exhausted by the length over which the field acts. The second manner in which the instant invention differentiates over the prior art is by maintaining a choke condition in the first conduit through which the energy transferring gas flows and is introduced into the enclosure. This choke condition determines that the velocity of the energy transferring gas will be transonic, thereby imparting directional momentum to the activated species thereof.

In operation, the method of the subject invention is carried out in a vacuumized enclosure or chamber of the type generally described with reference to FIG. 1. The vacuumized enclosure is first evacuated to a background pressure which, in conjunction with the substantially transonic flow rate of the energy transferring gas interiorly of the first conduit, will allow for the subsequent initiation and maintenance of a plasma of activated species of the energy transferring gas, which plasma has been carefully controlled to occur at the substantial minimum of the Paschen curve. It therefore becomes critical to select a pump which is sufficiently powerful to evacuate the enclosure to the low background pressure, despite the high flow rate of energy transferring gas constantly introduced thereinto. In one preferred embodiment, the pump is capable of evacuating and maintaining the enclosure to a background pressure of less than about 50 torr, and preferably in the range of approximately 0.01 mtorr to 10 mtorr, although the background pressure need not be limited to any given value.

Therefore, it should now be appreciated that each parameter (which relates to achieving a high flux of activated species and then having a high number of those activated species excite substantially all of a remotely introduced precursor deposition/etchant gas) can be independently controlled. Firstly, the microwave applicator power can be controlled to provide the high flux of activated species. Secondly, since no structural confinement exists and since the flow of the energy transferring gas is transonic, the loss of activated species due to collisions of activated species with walls prior to reaching the collision region is substantially eliminated and said activated species are transported to said collision region within the lifetime of ionized species thereof. Thirdly, because of the substantial pressure differential, the back diffusion of the precursor deposition/etchant gas has been eliminated. Fourthly, the low background pressure provides a long mean free path which prevents multiple collisions between the energized deposition/etchant species and all other particles prior to the deposition of those species on the substrate.

As specifically described, there is introduced into the interior of the vacuumized enclosure, inter alia, the energy transferring gas, which introduction is accomplished by a first conduit preferably having at least one aperture formed at the distal end thereof. The aperture is typically dimensioned to have a diameter of between about 0.25 to 3.0 cm and may be equipped with a solenoid operated aperture reduction structure and/or a protective overcoat, both of which elements have been fully described hereinabove.

The energy transferring gas is typically selected from the group consisting of the noble gases, hydrogen, methane, etchant gases, and combinations thereof. In a preferred embodiment, the energy transferring gas is helium, which when appropriately excited, yields long-lived activated species. Additionally, the energy transferring gas may include a number of diluent or dopant gases including, but not limited to, $O_2$, $NH_3$, $N_2$, $NH_4$, $H_2$, $CH_4$, $PH_3$, $PH_5$, $BF_3$, $BF_5$, $B_2H_6$, $BH_4$, and combinations thereof. The function of the diluent or dopant gas is to provide a source of an element to be incorporated into the deposited film. For example, if a thin film of silicon:germanium alloy material is being deposited upon the spacedly disposed substrate, the film may be rendered slightly p-type by the addition of small amounts of a p-type dopant, such as $BF_3$, into the flow of the energy transferring gas. Alternatively, in the deposition of a layer of insulating $SiO_x$ material, it will be necessary to include small amounts oxygen in the stream of the energy transferring gas. Regardless of composition, it is important that the energy transferring gas be delivered through said first conduit to a point immediately adjacent the activation means, such as directly into the interior of the radiant microwave applicator discussed hereinabove.

While the activation energy may be selected from the group consisting of a.c. energy, r.f. energy, microwave energy, photoactivation energy, and combinations thereof, in a preferred embodiment, the activation energy is microwave and the activation means is a radiant microwave applicator, such as the aforementioned radiant microwave waveguide which extends into the interior of the vacuumized enclosure. The radiant microwave applicator is adapted to provide about 1–10 kilowatts of microwave power at a frequency of 2.45 GHz. The energy transferring gas is delivered from the aperture in the first conduit through an opening hole formed in the side wall of the microwave applicator into an activation region located at least partially within the hollow interior of said applicator. The activation region is clearly defined as that region in which a plume of the activated species of the energy transferring gas is formed. The high flow rate of the energy transferring gas exiting the first conduit relative to the background pressure within the enclosure also defines a series of concentric pressure isobars which serve to limit the volume occupied by the plume of the activated species of that energy transferring gas.

The energy transferring gas is preferably delivered by the first conduit at a flow rate of at least about 100 SCCM, and more preferably approximately between 100–2000 SCCM. In this way, it is possible to maintain a preferred pressure differential of at least about a factor of five times difference between the background pressure that exists within the interior of the enclosure (less than about 50 torr, and preferably 0.1–10 mtorr) and the pressure of the energy proximate the aperture of the first conduit (which pressure may be as high as about 10–30 torr). It should be apparent that the pressure within any given isobar decreases with distance away from the aperture in the first conduit. Therefore, at any given power, the slope of the Paschen curve will provide a pressure-determined boundary of the activation region.

Figure 4:
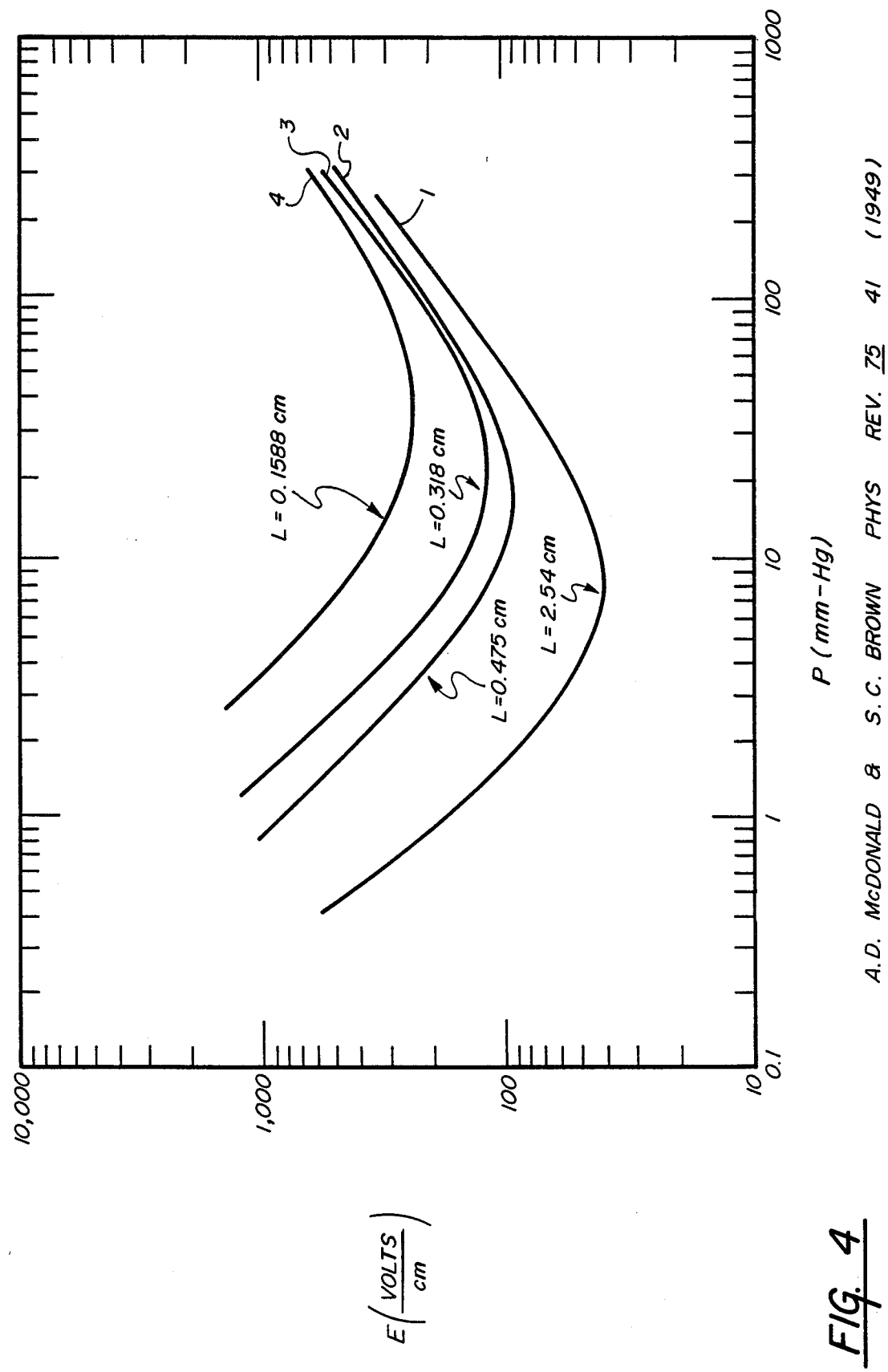
FIG. 4 is a graphic representation of modified Paschen curves, for different volume plumes of activated species, the curves having pressure displayed on the abscissa and power displayed on the ordinate, which Paschen curves are reproduced from an article by A. D. MacDonald, and S. C. Brown, published in Physical Review, Vol. 75, p. 411, (1949)

Additionally, and as may be appreciated from a perusal of FIG. 4, the pressure of the activated species of energy transferring gas within a plume of a given volume determines the power level which must be applied to form a plasma therefrom. In that regard, FIG. 4 depicts a series of discrete Paschen curves (numbered 1–4) for initiating and sustaining plasmas which occupy varying volumes. Plotted along the abscissa of the FIG. 1 graph is the pressure of the activated species of the energy transferring gas within a given isobar, in mm-Hg (where 1 mm Hg=1 torr) and plotted along the ordinate is the field applied in volts/cm. Each Paschen curve is unique to a plume of a given volume. For example, curve 1 describes the pressure/power regime required for a generally spherically shaped plume, the volume of which can be be calculated given the diameter (L) equal to 2.54 cm. It not only is important to operate at the minimum efficiency, but operation at the minimum of the Paschen curve allows for minor variations of pressure without falling off the curve and having the plasma extinguished.

For instance, in order to operate at the substantial minimum of Paschen curve 1 (the most efficient regime in which to operate), a pressure of approximately 10 torr and a power level of approximately 40 volts/cm is required. Note that in selecting the correct pressure-power regime in which to operate, it is necessary to select the proper volume plume and/or aperture size out of the discrete continuum of Paschen curves. In selecting this volume, and as can be best seen from FIG. 2, the plume of activated species 231 is made up of a plurality of substantially concentric, substantially spherical pressure isobars, such as 231a–231c. It must be appreciated that the pressure of the energy transferring gas introduced into the enclosure is substantially equalized with the background pressure over a given radial distance from the point of introduction at the mouth of the aperture 226. For instance, the inner spherical isobar may represent a pressure drop of 10 torr, the annular isobar defined between that spherical isobar and the outer granular isobar 231c may also represent another pressure drop of 10 torr and so on until the pressure differential is equalized. Of course, when the pressure differential becomes sufficiently small, the plume boundary is defined and the density of activated species melds into the background density of activated species.

It is worth reiterating at this juncture that in prior art remote activation apparatus, such as those discussed hereinabove, the activation region (defined as the plasma of activated species) could not be limited in size independently of the volume of the applied electromagnetic field. This was due to the fact that no appreciable pressure gradient was maintained between the background pressure existing within the reaction chamber and the pressure existing within the activation region, or the pressure existing within the deposition region. The absence of an appreciable pressure gradient, as well as the necessity of providing structural confinement of the generated activated species, results in, among other things, (1) the back diffusion of the deposition/etch species into the activation region, where direct excitation of those back-diffused deposition species may occur: (2) an unacceptably large number of multiple collisions between activated species of the energy transferring gas and the walls, even before the activated species enter the collision region; and (3) an unacceptably high number of multiple collisions between both the activated species and the precursor deposition species with the deposition species resulting in low deposition rates and poor material quality. By maintaining the pressure differential between the gas flow in the first conduit and the background pressure, by eliminating structural confinement of the activated species and by maintaining substantially transonic flow rates of said energy transferring gas in the first conduit, as discussed herein, each of the limitations inherent in these prior art remote deposition processes has been obviated.

After evacuating the enclosure, applying the electromagnetic field of microwave energy by means of the radiant microwave applicator and introducing a sufficient flow of the energy transferring gas (which, in conjunction with the background pressure in the enclosure and the power of the electromagnetic field), ignite a plasma of activated species from the high density of the energy transferring gas residing within the activation region; activated species of the energy transferring gas travel towards the collision region 65 illustrated in FIG. 1. The activated species of the energy transferring gas are in fact driven towards the collision region due to the high flow rate of the energy transferring gas exiting from the first conduit. The velocity which the flow rate imparts to the energy transferring gas is, at least initially, transonic, and in any case, must be of at least the same magnitude as the thermal velocity of said activated species. In other words, if the directional momentum imparted to the energy transferring gas is not substantially the same as or greater than the thermal velocity, the directional momentum will be lost in the low background pressure which exists in the enclosure.

It is to be recalled that the location of the collision region is defined by a second conduit having at least one aperture disposed at the distal end thereof, which distal end of the conduit extends into the interior of the vacuumized enclosure and terminates in close proximity to the substrate. The function of the second conduit is to deliver the precursor deposition/etchant gas into the collision region so that the activated species of the energy transferring gas may interact with the precursor gas to yield an energized deposition/etchant species. Preferred precursor deposition gases delivered to the collision region include, but are not limited to, silicon containing gases, germanium containing gases, carbon containing gases and combinations thereof. Preferred etchant gases include $NF_3$, $CF_4$, fluorocarbons, chlorocarbons, and combinations thereof. The precursor deposition/etchant gas is typically delivered into the collision region at a flow rate of at least about 10 SCCM and preferably between about 10 and 200 SCCM, with a preferred flow rate of between about 25 and 100 SCCM, and a most preferred flow rate of approximately 40 SCCM.

In the collision region, activated species of the energy transferring gas (i.e., helium) interact with the precursor deposition species (i.e., silane) in the following manner:

$$He^* + SiH_4 \rightarrow SiH_3 + H + He$$

The resulting $SiH_3^*$ and H then migrate from the collision region and are deposited upon the exposed surface of the substrate, which substrate is located a distance from the collision region that is within the length of the mean free path of the energized deposition species. The mean free path of the energized deposition species is the distance that the energized deposition (or etchant) species may travel without colliding with either other deposition species (such as free radicals) or encountering a second collision with activated species of the energy transferring gas. The mean free path of the energized deposition species should be approximately the length of the longest dimension of the substrate so that the uniform deposition of the energized deposition species over the entire exposed surface of the substrate is assured.

As is well known to those skilled in the art, the length of the mean free path of the energized deposition species is directly dependent upon the background pressure existing within the vacuumized enclosure through which those species will diffuse. For example, if the background pressure within the enclosure were relatively high, i.e., approximately one torr, the mean free path of the energized deposition species would be quite short (on the order of 1 mm or less). If on the other hand, the background pressure of the vacuumized enclosure is maintained at substantially sub-atmospheric levels, as approximately 1 millitorr, the mean free path of the energized deposition species will be considerably longer, on the order of 5-10 cm. It can thus be appreciated that the size of the substrate upon which the energized deposition species is to be deposited, will be one of the critical factors used in determining the length of the mean free path, and correspondingly, the background pressure at which the vacuumized enclosure must be maintained.

It should be equally apparent that once the background pressure of the vacuumized enclosure is determined, and the deposition rate is selected, each of the other parameters critical in initiating a plume of a given volume of activated species of the energy transferring gas are likewise determined. As was discussed hereinabove, as a rule of thumb, the flow rate of the energy transferring gas through the first conduit must be sufficient to create a pressure differential of at least about a factor of five between the energy transferring gas and the background pressure of the vacuumized enclosure for the uniform deposition of energized deposition species onto a substrate having a surface area of about 100 square cm. Thus, knowing the required length of the mean free path, the background pressure may be selected, and this background pressure dictates the possible range of flow rates at which the energy transferring gas must be introduced into the enclosure in order to maintain a significant pressure differential between the background pressure and the flow within the first conduit. This also determines the size aperture which will provide transonic flow at that flow rate of energy transferring gas.

Taking the usable range of flow rates of the energy transferring gas for a given background pressure, it then becomes possible to return to the Paschen curve illustrated in FIG. 4 to determine an optimized power/pressure regime in which to operate for a given volume of activated species. At a given power/pressure/aperture size regime, it is possible to determine the approximate percentage of the energy transferring gas which has been excited to form the activated species, (the typical range is 1-5% of, for example, He being promoted to the He* activated species). Knowing this percentage allows the operator to regulate the flow rate of the precursor deposition/etchant gas into the collision region, thereby maximizing the ratio of He* to precursor gas molecules to avoid the possibility of multiple collisions between the energized deposition species and the precursor deposition/etchant gas.

Understanding the methodology of the present invention, it is now possible to return to a discussion of the shortcomings inherent in the prior art RPECVD (remote plasma excitation CVD) apparatus and better understand how those shortcomings are obviated by the concepts set forth in the present invention. Chief among the problems observed in such RPECVD prior art apparatus is the unacceptably slow deposition rates, which slow rates can now be understood to be attributable to: (1) an insufficient pressure differential allowing the back diffusion of the precursor deposition gas into the activation region; (2) the presence of walls and the lack of transonic velocity allowing for multiple collisions between activated species of the energy transferring gas before those activated species can "drift" towards and enter the collision region, thereby resulting in a correspondingly depleted population (low density) of activated species available to collide with the precursor deposition/etchant gas; and (3) too high a background pressure resulting in a short mean free path of travel or the energized deposition/etch species, thereby causing multiple collisions between the energized deposition/etchant species and all other particles which results in a depleted population (low density) of deposition species available for deposition upon the substrate surface. As reiterated below, each of these limitations has been eliminated by the practice of the instant invention.

The existence of a plume of the activated species o the energy transferring gas acts a boundary or a "point source gas gate" which pushes the precursor deposition/etchant gas away from and maintains the chemical integrity of the activation region, thereby avoiding direct excitation and fragmentation of the precursor deposition/etchant gas into species which deleteriously effect the quality of the deposited thin film material. In order to achieve a similar isolation of gaseous precursor species, the prior art RPECVD apparatus had to rely upon geometrical restraints, i.e., the apparatus maintained a relatively long distance between the point of entry of the precursor deposition gas and the activation region. This approach was only marginally successful in preventing back-diffusion of precursor deposition gas, and further was responsible for creating a significant increase in the number of collisions between the activated species of the energy transferring gas before those activated species reached the collision region. The result was slow rates of deposition and the deposition of poor quality thin film material.

In greater detail, it should be appreciated that a relatively great distance was maintained between the activation region and the collision region in prior art RPECVD apparatus. Further, activated species of the energy transferring gas were required to drift towards the collision region in a substantially undirected, random manner (because of the inherent thermal velocity of the gas and the background pressure). Due to the length of this drift zone and the fact that the activated species traversed the zone in a substantially undirected manner, many if not most of the activated species fail to reach the collision region substantially within the lifetime thereof. Additionally, along the course of this relatively lengthy drift zone, there exists a substantial opportunity for multiple collisions between two or more of the activated species. Each of these collisions has the ability to "exterminate" the activated species which are involved therein, thus substantially depleting the number of activated species available for interaction with the precursor deposition gas in the collision region. This problem is substantially overcome by following the principles of operation disclosed by the instant invention.

By maintaining the appropriate pressure differential between the background pressure and the substantially transonic flow rate of the energy transferring gas in the first conduit, it is possible to impart a velocity to the activated species of the energy transferring gas which is greater than the inherent thermal velocity of the activated species, thereby imparting a directional momentum to those activated species of the energy transferring gas. This momentum directs said activated species toward the collision region in a substantially uniform, non-random manner. The result is the rapid transmission of the activated species to the collision region with a minimum of collisions occurring between activated species. This directional bias (or directional momentum) provides for greater numbers of activated species (a high density) arriving in the collision region. The instant inventors have observed a sufficient number of said activated species arriving in the collision region to substantially exhaust 100% of the precursor deposition/etchant gas introduced through the second conduit thereinto. Further, note that the pressure differential maintained by the instant invention, establishes a boundary of the activation region which is impregnable to diffusing deposition/etchant species. Accordingly, and further due to the low background pressure, calculations reveal that about 15% of the precursor gas is actually deposited upon the substrate, illustrating that an ion flux of activated species of over 25 milliamps per square centimeter has been achieved.

Finally, and as was discussed hereinabove, by maintaining a sufficiently low background pressure, it is possible to optimize the number of collisions (the mean free path) between energized deposition species prior to the deposition thereof upon the exposed surface of the substrate. The principles of the instant invention have also substantially eliminated the inadequacies in film quality observed in films produced by prior art RPECVD apparatus. This is achieved, in part, by preventing the direct excitation of the precursor deposition gas in the activation region, thereby eliminating the creation of undesired deposition species. Of course, the prevention of direct excitation is, in turn, accomplished by the "point source gas gate" effect, which point source gas gate effectively allows less than 1% the deposition/etchant gas to enter the activation region previously described (due, in part to the high velocity of the energy transferring gas which dynamically isolates the precursor deposition region from the activation region). In this manner, the instant invention is capable of depositing thin films of very high quality material at commercially viable rates.

In order to place the importance of the instant invention in true perspective, the instant inventors, utilizing the principles disclosed herein, have (1) deposited high quality amorphous silicon alloy material at rates of as high as 450 Angstroms per second (two orders of magnitude higher than r.f. PECVD processes and a factor of five higher than microwave PECVD processes); (2) have deposited silicon alloy material exhibiting 4-5 orders of magnitude of photoconductivity; and have deposited silicon alloy material characterized by a density of defect states of about $10^{16}$ defects/cm$^{-3}$/eV. The inventors believe that the quality of the material will continue to improve as improvements, such as improvements geared to reduce the amount of sputtered waveguide or graphite material, are implemented. For instance, the cut-away portion of the microwave applicator has now been nickel plated to reduce the presence of copper in the deposited film. Improved film quality should result.

Prior to completing this discussion, it must once again be noted that the "critical" pressure differential which must be maintained, as well as the "critical" deposition rate made possible through the use of the method described herein have been rather arbitrarily selected. Since the pressure differential is dependent on such parameters as background pressure, size of the substrate, size of the aperture in the first conduit, amount of power supplied, gases utilized, etc., no universal value can be calculated. The value of "about a factor of five" has been selected and used in the claims because it is sufficiently great to constitute a substantially universal truth. However, the instant inventors adamantly state their intention to be bound only by the broader principles espoused herein and not by such specific numerical values.

It should be recognized that the foregoing description and discussion are merely meant to illustrate the principles of the instant invention and not meant to be a limitation upon the practice thereof. It is the following claims, including all equivalents, which are meant to define the true scope of the instant invention.

What is claimed is:

1. A method of fabricating high quality thin films at a relatively high rate of deposition, said method comprising the steps of:
   providing an enclosure;
   maintaining the interior of said enclosure at a subatmospheric background pressure;
   introducing an energy transferring gas into the interior of said enclosure through at least one aperture formed in a first conduit;
   creating a choke condition adjacent the aperture in said first conduit so as to provide a localized high pressure of energy transferring gas flowing therethrough;
   activating said energy transferring gas in an activation region so as to form a high density plume of activated species from said energy transferring gas;
   introducing a precursor deposition gas into the interior of said enclosure through a second conduit; the point of introduction of said precursor deposition gas from said second conduit into said enclosure being spacedly disposed relative to said activation region, whereby collisions of said high density of activated species with said precursor deposition gas define a collision region in which a high density of energized deposition species of said precursor deposition gas are generated;
   operatively disposing substrate means interiorly of said enclosure for depositing energized deposition species of said precursor deposition gas thereupon; said substrate means spacedly positioned from said activation region a distance sufficient to substantially prevent electron damage; and
   maintaining a substantial pressure differential between the pressure of said energy transferring gas in said first conduit and the background pressure in said enclosure, said pressure differential being sufficient to, provide for the activation of a high density of activated species of said energy transferring gas, whereby high quality thin film material of desired deposition species is deposited onto said substrate at a rate greater than about 5 Angstroms per second.

2. A method as in claim 1, including the further step of selecting the flow rate of energy transferring gas in said first conduit so as to provide a sufficient pressure of said energy transferring gas adjacent said aperture for initiating a plasma from said energy transferring gas at a power-pressure-aperture size regime which is at the substantial minimum of the Paschen curve.

3. A method as in claim 1, including the further step of reducing the size of said aperture relative to the size of the first conduit so as to form said choke condition adjacent said aperture.

4. A method as in claim 3, including the further step of controlling the size of said aperture reduction.

5. A method as in claim 4, including the further step of providing solenoid means to control the size of said aperture reduction.

6. A method as in claim 2, including the further step of increasing the time of residency of said energy transferring gas adjacent said aperture, whereby the density of said activated species adjacent said aperture is also increased.

7. A method as in claim 6, including the further step of providing a magnetic field to increase the time of residency of said activated species adjacent said aperture.

8. A method as in claim 1, including the further step of providing means for cooling said first conduit.

9. A method as in claim 8, including the further step of circulating a coolant medium through a concentrically disposed tube.

10. A method as in claim 1, including the further step of providing means for reducing degradation of the surface of said first conduit adjacent said aperture.

11. A method as in claim 10, including the further step of providing a protective overcoat at least partially encapsulating the aperture portion of said first conduit to reduce the degradation thereof.

12. A method as in claim 11, including the further step of selecting said protective overcoat from substantially high temperature, sputter-resistant material.

13. A method as in claim 12, including the further step of selecting said protective overcoat from a benign material which does not deleteriously effect the desired properties of the deposited thin film.

14. A method as in claim 13, including the further step of forming a sputter-resistant overcoat of graphite about the aperture portion of said first conduit.

15. A method as in claim 1, including the further step of selecting said energy transferring gas from the group consisting essentially of hydrogen, the noble gases, $CH_4$ and combinations thereof.

16. A method as in claim 1, including the further step of selecting said precursor deposition gas so that, upon collision of activated species of said energy transferring gas therewith, one or more desired deposition species of said precursor deposition gas will be formed.

17. A method as in claim 16, including the further step of selecting the precursor deposition gas from the group consisting essentially of a silicon-containing gas, a carbon-containing gas, a germanium-containing gas, and combinations thereof.

18. A method as in claim 7, including the further step of selecting the precursor deposition gas from the group consisting essentially of $SiH_4$, $SiF_4$, $Si_2H_6$, $GeH_4$, $GE_2H_6$, $GeF_4$, $CH_4$, and combinations thereof.

19. A method as in claim 17, including the further step of selecting helium as the energy transferring gas, whereby the activated species of said energy transferring gas is metastable helium.

20. A method as in claim 17, including the further step of selecting said energy transferring gas and said precursor deposition gas so that upon collision of activated species of said energy transferring gas and said precursor deposition gas, one or more desired combination species will be formed.

21. A method as in claim 20, including the further step of selecting said energy transferring gas so as to further include one or more gases from the group consisting essentially of $O_2$, $NH_3$, $N_2$, $NH_4$, $CH_4$, $PH_3$, $PH_5$, $BF_3$, $BF_5$, $B_2H_6$, $BH_4$, and combinations thereof.

22. A method as in claim 1, including the further step of photoactivating said energy transferring gas.

23. A method as in claim 1, including the further step of utilizing alternating current to activate said energy transferring gas.

24. A method as in claim 23, including the further step of utilizing r.f. energy to activate said energy transferring gas.

25. A method as in claim 23, including the further step of utilizing microwave energy to activate said energy transferring gas.

26. A method as in claim 25, further including the step of employing a radiant microwave applicator to activate said energy transferring gas flowing through the aperture in said first conduit.

27. A method as in claim 26, including the further step of operatively disposing the aperture portion of said first conduit adjacent said applicator for activating said energy transferring gas.

28. A method as in claim 27, including the further steps of forming said first conduit from a microwave transmissive material and disposing said aperture portion within said radiant microwave applicator, whereby said activated species are primarily initiated interiorly of said first conduit.

29. A method as in claim 27, including the further steps of forming said first conduit from a microwave non-transmissive material, whereby said activated species are primarily initiated exteriorly of said first conduit.

30. A method as in claim 1, including the further step of maintaining the background pressure in said enclosure at least a factor of five less than the pressure of said energy transferring gas flowing in said first conduit, whereby a plume of pressure isobars is formed by the activated species of said energy transferring gas.

31. A method as in claim 30, including the further step of applying an electromagnetic field to form the activated species plume, and limiting the volume occupied by said activated species plume, without the use of structural confinement, to a volume less than the volume occupied by said electromagnetic field.

32. A method as in claim 31, including the further step of controlling the volume of said activated species plume by controlling the pressure differential between the background pressure and the pressure of the energy transferring gas in said first conduit.

33. A method as in claim 1, including the further step of maintaining the background pressure in said enclosure in the range of less than about 50 torr.

34. A method as in claim 33, including the further step of introducing a flow rate of at least about 10 SCCM of said precursor deposition gas through said second conduit into said enclosure.

35. A method as in claim 34, including the further step of introducing a flow rate of about 10 to 200 SCCM of said precursor deposition gas through said second conduit into said enclosure.

36. A method as in claim 33, including the further step of introducing a flow rate of at least about 100 SCCM of said energy transferring gas through said first conduit into said enclosure.

37. A method as in claim 36, including the further step of introducing a flow rate of about 100 to 2000 SCCM of said energy transferring gas through said first conduit into said enclosure.

38. A method as in claim 1, including the further step of maintaining pressure isobars of about one-half the pressure at which the substantial minimum of the Paschen curve for a given energy transferring gas occurs adjacent the aperture portion of said first conduit.

39. A method as in claim 1, including the further step of operatively disposing said substrate means a distance from said collision region less than the length of the mean free path of said energized deposition species.

40. A method as in claim 1, including the further step of providing a flow rate of said energy transferring gas through said first conduit relative to the background pressure in said enclosure which imparts a velocity to said activated species of said energy transferring gas of at least the same magnitude as the thermal velocity of said activated species, whereby said activated species are directed toward said collision region.

41. A method as in claim 40, including the further step of imparting a velocity to said activated species which is initially substantially transonic.

* * * * *